United States Patent
Hong et al.

(10) Patent No.: US 11,150,766 B2
(45) Date of Patent: Oct. 19, 2021

(54) SWITCHING OPERATION SENSING DEVICE WITH TOUCH-SENSING AND FORCE-SENSING USING DUAL-SENSING STRUCTURE

(71) Applicant: Samsung Electro-Mechanics Co., Ltd., Suwon-si (KR)

(72) Inventors: Byung Joo Hong, Suwon-si (KR); Joo Yul Ko, Suwon-si (KR); Je Hyuk Ryu, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 85 days.

(21) Appl. No.: 16/822,317

(22) Filed: Mar. 18, 2020

(65) Prior Publication Data

US 2021/0041982 A1 Feb. 11, 2021

(30) Foreign Application Priority Data

Aug. 6, 2019 (KR) .................. 10-2019-0095737
Oct. 24, 2019 (KR) .................. 10-2019-0132913

(51) Int. Cl.
*G06F 3/041* (2006.01)
*G06F 3/044* (2006.01)
(Continued)

(52) U.S. Cl.
CPC .......... *G06F 3/0418* (2013.01); *G06F 3/046* (2013.01); *G06F 3/0447* (2019.05);
(Continued)

(58) Field of Classification Search
CPC ...... G06F 3/0418; G06F 3/046; G06F 3/0447; G06F 2303/04106–04107; H03K 17/96;
(Continued)

(56) References Cited

U.S. PATENT DOCUMENTS

2015/0130649 A1   5/2015 Itakura et al.
2017/0075429 A1*  3/2017 Bromer .................. G06F 3/017
(Continued)

FOREIGN PATENT DOCUMENTS

JP   2012-168747 A   9/2012
JP   2015-095865 A   5/2015
(Continued)

*Primary Examiner* — Alexander Eisen
*Assistant Examiner* — Nathaniel P Brittingham
(74) *Attorney, Agent, or Firm* — NSIP Law

(57) ABSTRACT

A switching operation sensing device includes an input operation unit, an oscillator circuit, a frequency digital converter, and a touch-force detector circuit. The input operation unit, integrally formed with a housing, includes a first switch member and a second switch member disposed in different positions. The oscillator circuit is configured to generate a first oscillation signal based on varying capacitance when the first switch member is touched, and a second oscillation signal based on varying inductance when an input force is applied to the second switch member. The frequency digital converter is configured to convert the first oscillation signal to a first count value, and convert the second oscillation signal to a second count value. The touch-force detector circuit is configured to generate a first detection signal by detecting a touch input based on the first count value input from the frequency digital converter, and generate a second detection signal by detecting an input force based on the second count value.

23 Claims, 18 Drawing Sheets

(51) Int. Cl.
   *G06F 3/046*     (2006.01)
   *H03H 17/06*     (2006.01)
   *H03K 17/96*     (2006.01)

(52) U.S. Cl.
   CPC .... *H03H 17/0664* (2013.01); *H03H 17/0671* (2013.01); *H03K 17/962* (2013.01); *G06F 2203/04106* (2013.01); *G06F 2203/04107* (2013.01)

(58) Field of Classification Search
   CPC ......... H03K 17/962; H03K 2017/9706; H03K 2017/9613; H03K 2017/9615; H03H 17/0664; H03H 17/0671
   See application file for complete search history.

(56) References Cited

U.S. PATENT DOCUMENTS

| | | | |
|---|---|---|---|
| 2017/0269754 A1* | 9/2017 | Liu | G06F 3/0444 |
| 2018/0081221 A1* | 3/2018 | Liu | G06F 3/0362 |
| 2018/0093695 A1 | 4/2018 | Hattori et al. | |
| 2018/0120364 A1 | 5/2018 | Lee et al. | |

FOREIGN PATENT DOCUMENTS

| | | |
|---|---|---|
| KR | 10-2002-0077836 A | 10/2002 |
| KR | 10-2009-0120709 A | 11/2009 |
| KR | 10-2011-0087004 A | 8/2011 |
| KR | 10-2011-0087014 A | 8/2011 |
| KR | 10-2018-0046833 A | 5/2018 |

\* cited by examiner

WHEN THERE IS NO TOUCH INPUT

WHEN THERE IS TOUCH INPUT

SWITCHING OPERATION SENSING DEVICE WITH TOUCH-SENSING AND FORCE-SENSING USING DUAL-SENSING STRUCTURE

CROSS-REFERENCE TO RELATED APPLICATION(S)

This application claims the benefit under 35 USC 119(a) of priority to Korean Patent Application No. 10-2019-0095737 filed on Aug. 6, 2019 and Korean Patent Application No. 10-2019-0132913 filed on Oct. 24, 2019, in the Korean Intellectual Property Office, the entire disclosures of which are incorporated herein by reference for all purposes.

BACKGROUND

1. Field

The present disclosure relates to a switching operation sensing device with a touch-sensing function and a force-sensing function using a dual-sensing structure.

2. Description of Related Art

Generally, a thin wearable device with a simplified design without a mechanical switch is preferable in a wearable device. The above-described change has been partly possible by implementing a water-proof technique and a dust-proof technique, and the development of a device model with a smooth and integrated design.

Currently, techniques such as a touch-on-metal technique of touching a metal, a capacitor sensing method using a touch panel, a micro-electro-mechanical-system (MEMS), a micro strain gauge, and the like, have been developed, and also, a force-touching function has been developed.

As for a general mechanical switch, a relatively large size and amount of space may be required internally to implement a switch function, and due to an externally protruding design, a structure in which the switch is not integrated with an external case, or the like, the mechanical switch may have an obtrusive design and may require a large space.

Also, there may be a risk of an electric shock with a direct contact with an electrically connected mechanical switch, and dust-proofing and water-proofing of the mechanical switch may difficult due to its structural design.

Further, a general switch device has typically been required to implement both a touch-sensing function and a force-sensing function.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a switching operation sensing device includes an input operation unit, an oscillator circuit, a frequency digital converter, and a touch-force detector circuit. The input operation unit, integrally formed with a housing, includes a first switch member and a second switch member disposed in different positions. The oscillator circuit is configured to generate a first oscillation signal based on varying capacitance when the first switch member is touched, and a second oscillation signal based on varying inductance when an input force is applied to the second switch member. The frequency digital converter is configured to convert the first oscillation signal to a first count value, and convert the second oscillation signal to a second count value. The touch-force detector circuit is configured to generate a first detection signal by detecting a touch input based on the first count value input from the frequency digital converter, and generate a second detection signal by detecting an input force based on the second count value.

The frequency digital converter may be configured to generate the first count value by counting a clock signal using the first oscillation signal, and generate a second count value by counting a clock signal using the second oscillation signal.

The oscillator circuit may include a first oscillator circuit configured to generate the first oscillation signal based on the varying capacitance, and a second oscillator circuit configured to generate the second oscillation signal based on the varying inductance.

The first oscillator circuit may include a first inductance circuit including a first coil element disposed on an inner side surface of the first switch member, a first capacitance circuit including a first capacitance device connected to the first inductance circuit and having varying capacitance when the first switch member is touched, and a first amplifier circuit configured to generate the first oscillation signal having a first resonant frequency based on the first inductance circuit and the first capacitance circuit.

The second oscillator circuit may include a second inductance circuit including a second coil element spaced apart from an inner side surface of the second switch member, a second capacitance circuit including a second capacitance device connected to the second inductance circuit, and a second amplifier circuit configured to generate the second oscillation signal having a second resonant frequency based on the second inductance circuit and the second capacitance circuit.

A surface of the first coil element may be attached to an inner side surface of the first switch member and another surface is mounted on a first substrate. The surface of the second coil element may be spaced apart from an inner side surface of the second switch member and another surface is mounted on the first substrate.

The frequency digital converter may include a first frequency digital converter configured to convert the first oscillation signal to the first count value by counting the clock signal using the first oscillation signal received from the oscillator circuit, and a second frequency digital converter configured to convert the second oscillation signal to the second count value by counting the clock signal using the second oscillation signal received from the oscillator circuit.

The first frequency digital converter may include a first frequency down converter configured to generate a firstly divided reference clock signal by dividing a reference frequency signal using a reference frequency divide ratio, a first periodic timer configured to output a first period count value generated by counting a period of time of a first period of the firstly divided reference clock signal received from the first frequency down converter using the first oscillation signal, and a first CIC filter circuit configured to output the first count value generated by performing accumulative amplification for the first period count value received from the first periodic timer.

The first CIC filter circuit may include a decimator CIC filter configured to output the first count value generated by performing the accumulative amplification, perform the accumulative amplification using an accumulative gain determined by a predetermined integration stage order, a decimator factor, and a comb differentiation delay order, and provide the accumulative-amplified first period count value.

The second frequency digital converter may include a second frequency down converter configured to generate a secondly divided reference clock signal by dividing a reference frequency signal using a reference frequency divide ratio, a second periodic timer configured to output a second period count value generated by counting a period of time of a first period of the secondly divided reference clock signal received from the second frequency down converter using the second oscillation signal, and a second CIC filter circuit configured to output the second count value generated by performing accumulative amplification for the second period count value received from the second periodic timer.

The second CIC filter circuit may include a decimator CIC filter configured to output the second count value generated by performing the accumulative amplification, and perform the accumulative amplification using an accumulative gain determined by a predetermined integration stage order, a decimator factor, and a comb differentiation delay order and to provide the accumulative-amplified second period count value.

The touch-force detector circuit may be configured to generate first and second differential values by differentiating the first count value and the second count value received from the frequency digital converter, respectively, compare the first and second differential values with a predetermined touch threshold value and a predetermined force threshold value, and output the first detection signal corresponding to a touch or the second detection signal corresponding to the input force based on a result of the comparison.

The touch-force detector circuit may include a first delay circuit configured to output a first delay count value generated by delaying the first count value received from the first frequency digital converter by a period of time determined by a first delay control signal, a first subtraction circuit configured to output a first differential value generated by subtracting the first count value from the first delay count value received from the first delay circuit, a second delay circuit configured to output a second delay count value generated by delaying the second count value received from the second frequency digital converter by a period of time determined by a second delay control signal, a second subtraction circuit configured to output a second differential value generated by subtracting the second count value from the second delay count value received from the second delay circuit, and a touch-force detector configured to compare the first differential value and the second differential value with a predetermined touch threshold value and a predetermined force threshold value, respectively, and output the first detection signal having a first level corresponding to a touch and the second detection signal having a second level corresponding to an input force.

The touch-force detector may include a touch detector circuit configured to compare the first differential value with the predetermined touch threshold value and to output the first detection signal having the first level corresponding to the touch based on a result of the comparison, and a force detector circuit configured to compare the second differential value with the predetermined force threshold value and to output the second detection signal having the second level corresponding to the input force based on a result of the comparison.

The touch detector circuit may include a touch slope direction detector configured to detect a degree and a direction of a touch slope based on the first differential value, and a touch detector configured to determine whether a touch is sensed or a touch is released by comparing the first differential value, the degree of the touch slope, with a touch hysteresis upper limit and a touch hysteresis lower limit based on the direction of the touch slope.

The force detector circuit may include a force slope direction detector configured to detect a degree and a direction of a force slope based on the second differential value, and a force detector configured to determine whether a touch is sensed or a touch is released by comparing the second differential value, the degree of the force slope, with a force hysteresis upper limit and a force hysteresis lower limit based on the direction of the force slope.

The switching operation sensing device may be any of Bluetooth headset, Bluetooth earphone, smart glasses, a VR headset, an AR headset, smart key button of a vehicle, laptop, computer, a head-mounted display (HMD), and a stylus touch pen.

In another general aspect, an electronic device includes a housing, an input operation unit, and a circuit unit. The input operation unit, integrally formed with the housing, includes a first switch member and a second switch member disposed in different positions. The circuit unit is configured to: generate a first oscillation signal based on varying capacitance when the first switch member is touched, and a second oscillation signal based on varying inductance when an input force is applied to the second switch member; convert the first oscillation signal to a first count value, and convert the second oscillation signal to a second count value; and generate corresponding detection signals based on the first count value input and the second count value.

An oscillator circuit, disposed in the housing, may be configured to generate the first oscillation signal and the second oscillation signal.

A frequency digital converter, connected to the oscillator circuit, may be configured to convert the first oscillation signal to the first count value and the second oscillation signal to the second count value.

A touch-force detector circuit, connected to the frequency digital converter, may be configured to generate the first detection signal and the second detection signal.

The circuit unit may be configured to generate the first count value by counting a clock signal using the first oscillation signal, and generate a second count value by counting a clock signal using the second oscillation signal.

The electronic device may be any of Bluetooth headset, Bluetooth earphone, smart glasses, a VR headset, an AR headset, smart key button of a vehicle, laptop, computer, a head-mounted display (HMD), and a stylus touch pen.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
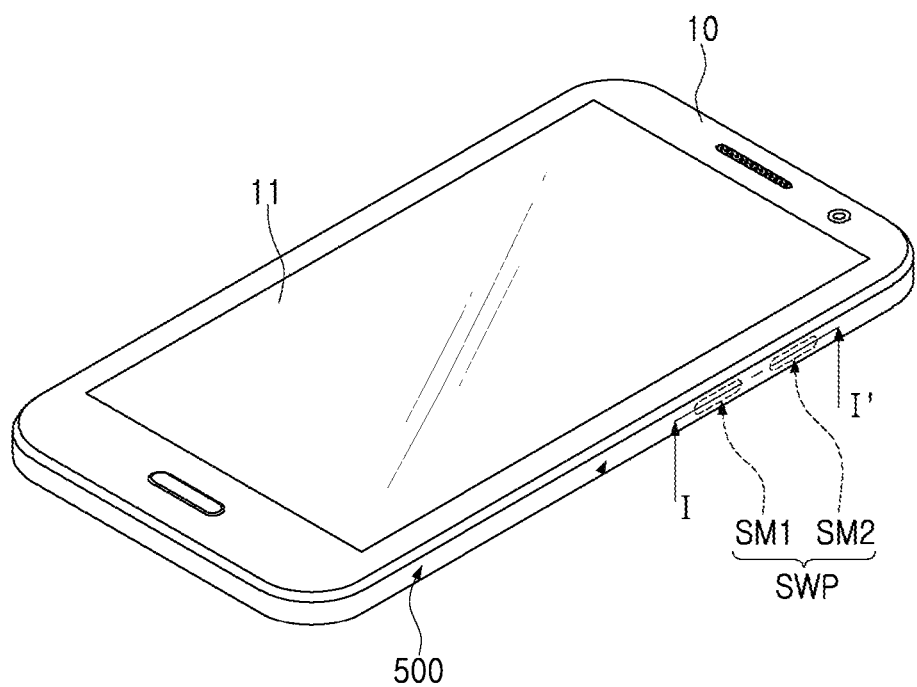
FIG. 1 is a diagram illustrating an example of an exterior of a mobile device having a switching operation sensing device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating an example of an exterior of a mobile device having a switching operation sensing device.

In FIG. 1, a mobile device 10 in the example embodiment may include a touch screen 11, a housing 500, and a control input unit SWP.

The control input unit SWP may include a first switch member SM1 and a second switch member SM2. As an example, the first switch member SM1 and the second switch member SM2 may be disposed in a region in which the first switch member SM1 and the second switch member SM2 may simultaneously react when a single control is input. Accordingly, when a single control is input, a first detection signal and a second detection signal, corresponding to the first switch member SM1 and the second switch member SM2, respectively, may be generated. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

As an example, in FIG. 1, the mobile device 10 may be implemented by, representative of, a portable device such as a smartphone, a wearable device such as a smart watch, or the like. The mobile device 10 may not be limited to any particular device, and may be implemented by a portable or wearable electrical device, or an electrical device having a switch for operation control.

The housing 500 may be configured as an outer, externally exposed, case on an electrical device. As an example, when the switching operation sensing device is applied to a mobile device, the housing 500 may be configured as a cover disposed on a side (a lateral surface) of the mobile device 10. As an example, the housing 500 may be integrated with a cover disposed on a rear surface of the mobile device 10, or may be separated from a cover disposed on the rear surface of the mobile device 10.

The control input unit SWP may be disposed on the housing 500 of the mobile device 10, but an example embodiment thereof is not limited thereto. The switching operation sensing device may be disposed in a housing of an electrical device. In FIG. 1, the control input unit SWP may be disposed on a cover of the mobile device 10, and in this case, the cover may be configured as a cover which does not include a touch screen, such as a side cover, a rear cover, a cover disposed on a front surface, or the like, for example. In the example embodiment, an example in which the housing is disposed on a side cover of the mobile device 10 will be described for ease of description, but an example embodiment thereof is not limited thereto.

The control input unit SWP may be configured to be integrated with the housing 500, and may include at least two switch members for sensing a touch input and an input force, the first switch member SM1 and the second switch member SM2.

In FIG. 1, an example in which the control input unit SWP includes the first and second switch members SM1 and SM2 is described for ease of description, but an example embodiment thereof is not limited thereto. A higher number of switch members may be also included.

In the diagrams, unnecessary overlapping descriptions in relation to the same reference numeral and the same function will not be provided, and mainly differences among the examples in the diagrams will be described.

Figure 2:
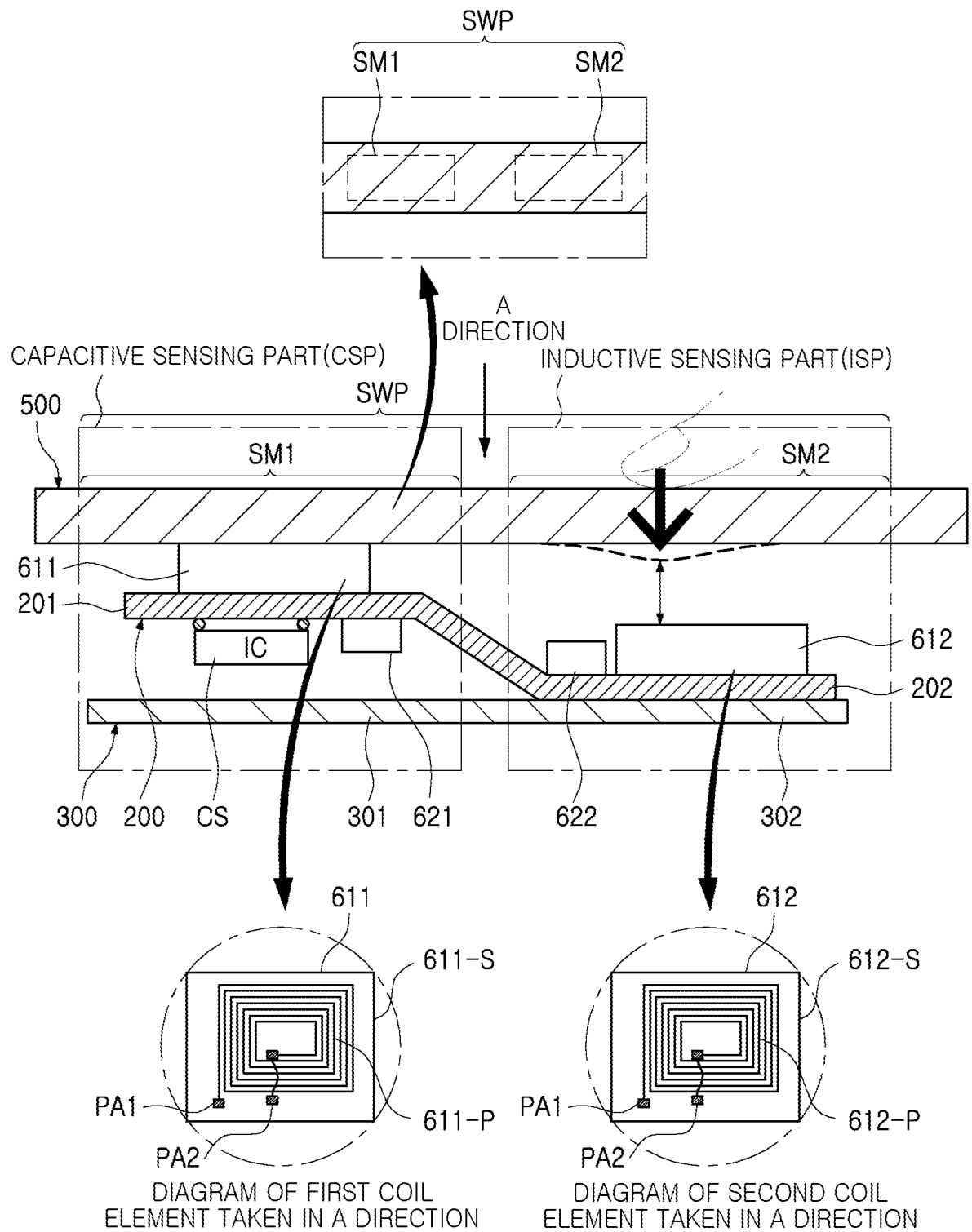
FIG. 2 is a cross-sectional diagram illustrating an example of a switching operation sensing device along line I-I' in FIG. 1.

FIG. 2 is a cross-sectional diagram illustrating an example of a switching operation sensing device along line I-I' in FIG. 1.

In FIG. 2, a switching operation sensing device in the example embodiment may include a capacitive sensing part CSP configured to perform a capacitive sensing operation and an inductive sensing part ISP configured to perform an inductive sensing operation.

The capacitive sensing part CSP may include a first switch member SM1 integrated or integrally formed with the housing 500 of a mobile device, a first capacitor device 621 included in a first capacitance circuit, a first coil element 611 included in a first inductance circuit, and a circuit unit CS configured to generate a first oscillation signal including a first resonant frequency determined by the first capacitance circuit and the first inductance circuit.

The inductive sensing part ISP may include a second switch member SM2 integrated or integrally formed with the housing 500 of the mobile device, a second capacitor device 622 included in a second capacitance circuit, a second coil element 612 included in a second inductance circuit, and the circuit unit CS configured to generate a second oscillation signal having a second resonant frequency determined by the second capacitance circuit and the second inductance circuit. For example, the circuit unit CS may be included in one of the capacitive sensing part CSP and the inductive sensing part ISP, but an example embodiment thereof is not limited thereto.

The first switch member SM1 may include, or be formed of, a material the same as a material of the housing 500. The second switch member SM2 may be spaced apart from the first switch member SM1 and may include, or be formed of, a material the same as a material of the housing 500.

As for the capacitive sensing part CSP illustrated in FIG. 2, one surface of the first coil element 611 may be attached to an inner side surface of the first switch member SM1, and the other surface may be mounted on one surface of a first substrate 200 spaced apart from a first bracket 301.

As an example, the first coil element 611 attached to the inner side surface of the first switch member SM1 may be mounted on one surface of the first substrate 201. The circuit unit CS and the first capacitor device 621 may be mounted on the other surface of the first substrate 201.

The first bracket 301 may be spaced apart from the first substrate 201 (or the first coil element 611) by a predetermined gap. As an example, the first bracket 301 may be a conductor such as a metal, attached to an internal structure of an electrical device to which a first switching operation sensing device is applied, and supported by a support member. However, the first bracket 301 may not be limited to any particular structure as long as the first bracket 301 maintains a certain distance from the first coil element 611 (or the first substrate).

Accordingly, the circuit unit CS, the first coil element 611, and the first capacitor device 621 may be disposed on the first substrate 201, and the circuit unit CS, the first coil element 611, and the first capacitor device 621 may be electrically connected to one another through the first substrate 201.

As for the inductive sensing part ISP illustrated in FIG. 2, one surface of the second coil element 612 may be spaced apart from an inner side surface of the second switch member SM2 and may oppose the second switch member SM2, and the other surface may be in contact with one surface of a second substrate 202.

The second coil element 612 and the second capacitor device 622 may be mounted on one surface of the second substrate 202. A second bracket 302 may be attached to the other surface of the second substrate 202. The second bracket 302 may support the second substrate 202 on which the second coil element 612 and the second capacitor device 622 are mounted. Accordingly, a predetermined gap between the second substrate 202 and an inner side surface of the second switch member SM2 may be maintained by the second bracket 302.

The other surface of the second substrate 202 (e.g., a flexible printed circuit board (FPCB)) may be attached to a mounting surface of the second bracket 302. The first substrate 201 and the second substrate 202 may be integrated or integrally formed with each other as a single substrate 200, as illustrated in FIG. 2, but an example embodiment thereof is not limited thereto. In this example, the substrate 200 may be configured as an FPCB, and may include the first substrate 201 and the second substrate 202.

The first substrate 200 may be configured as a printed circuit board (PCB) or an FPCB, but an example embodiment thereof is not limited thereto. The first substrate 200 may also be configured as a board (e.g., one of various circuit boards, including a PCB) or a panel (e.g., a panel used for a panel level package (PLP)) on which a circuit pattern is formed.

The circuit unit CS, the second coil element 612, the second capacitor device 622 may be electrically connected to one another through the substrate 200, including the first substrate 201 and the second substrate 202.

The first bracket 301 and the second bracket 302 may be integrated, or integrally formed, as a single bracket 300, as illustrated in FIG. 2, but an example embodiment thereof is not limited thereto.

In the diagram of the housing depicted in the A direction in FIG. 2, as an example, the housing 500 may be a conductor such as a metal. The first switch member SM1 and the second switch member SM2 may be integrated, or integrally formed, with the housing 500, and may be a conductor similar to the housing 500, for example.

In the diagrams of the first and second coil elements 611 and 612 taken in the A direction in FIG. 2, the first coil element 611 may include a coil pattern 611-P connected between a first connection pad PA1 and a second connection pad PA2 as a coil-type pattern. The coil pattern 611-P may be configured as a PCB pattern formed on a coil substrate 611-S, for example. The first connection pad PA1 and the second connection pad PA2 may be electrically connected to the circuit unit CS and the first capacitor device 621 through the first substrate 201 and the second substrate 202.

The second coil element 612 may include a coil pattern 612-P, connected between the first connection pad PA1 and the second connection pad PA2, in a coil-type pattern. The coil pattern 612-P may be configured as a PCB pattern formed on a coil substrate 612-S. The first connection pad PA1 and the second connection pad PA2 may be electrically connected to the circuit unit CS and the second capacitor device 622 through the first substrate 201 and the second substrate 202.

In FIG. 2, the circuit unit CS may be mounted on the first substrate 201 of the substrate 200, but an example embodiment thereof is not limited thereto. The circuit unit CS may be mounted on any region of the substrate 200. As an example, the circuit unit CS may be mounted on the second substrate 202.

As described above, in the capacitive sensing part CSP, the first coil element 611 and the first bracket 301 may be spaced apart from each other by a predetermined gap. The shape of the first coil element 611 may not be limited to any particular shape, and various patterns such as a circular shape or a rectangular shape may be used. Also, the first coil element 611 may be configured as a PCB, such as a flexible printed circuit board FPCB. As an example, the first coil element 611 may be configured as a chip inductor. Also, the first substrate 201 may be configured as an FPCB, or may be configured as various types of PCBs other than an FPCB.

Based on the capacitive sensing part CSP, when the first switch member SM1 of the housing 500 is touched, parasitic capacitance may be formed in the first switch member SM1 and the first coil element 611 such that capacitance may change, and accordingly, a capacitive sensing operation may be available.

In the inductive sensing part ISP, the second coil element 612 may be spaced apart from the second switch member SM2 by a predetermined gap. The shape of the second coil element 612 may not be limited to any particular shape, and various patterns such as a circular shape or a rectangular shape may be used. Also, the second coil element 612 may be configured as a PCB, such as a flexible printed circuit board FPCB. As an example, the second coil element 612 may be configured as a chip inductor.

Also, the second substrate 202 may be configured as an FPCB; however, various types of PCBs may be used other than an FPCB. As an example, a ferrite sheet (not illustrated) may be disposed on a lower surface of the second coil element 612.

As illustrated in FIG. 2, the second substrate 202 on which the second coil element 612 (e.g., a PCB coil) and the second capacitor device 622 (e.g., an MLCC) are disposed may be mounted on the second bracket 302. The second bracket 302 may maintain a constant distance between the second coil element 612 and the second switch member SM2.

Based on the inductive sensing part ISP, when the second switch member SM2 is pressed by force, the second switch member SM2 may be pressed such that a distance between the second switch member SM2 and the second coil element 612 may change. Due to the distance change, the inductance of the second coil element 612 may change, and accordingly, an inductive sensing operation may be available.

Each of the first and second coil elements 611 and 612 may be configured as a coil device, such as a solenoid coil, a coil-type inductor, or a chip inductor, but example embodiments thereof are not limited to. Each of the first and second coil elements 611 and 612 may be configured as a device having an inductance.

As an example, when a conductor included in the first and second switch members SM1 and SM2 is formed of a metal having high resistance (e.g., 100KΩ or higher), the interference between the two first and second switch members SM1 and SM2 may be reduced such that the first and second switch members SM1 and SM2 may be used in an actual electrical device.

When a dual-sensing structure, as in the example embodiment illustrated in FIG. 2, is used, both sensing operations, the capacitive sensing operation and the inductive sensing operation, may be performed to detect both a touch input and an input force.

In an example embodiment, a touch input may refer to a decrease in resonant frequency based on a parasitic capacitance generated when a conductor, such as a human hand, is proximate to or touches a first switch member of the housing. An input force may refer to an increase in resonant frequency based on changes in inductance caused by a change in distance between the second switch member and the second coil element when force is applied by a conductor, such as a human hand or a non-conductor such as plastic that presses the second switch member of the housing.

The structure of the switching operation sensing device is not limited to the example illustrated in FIG. 2, and a constant gap between the second switch member SM2 and the second coil element 612 may be maintained using the second bracket, such that an inductive sensing operation may be available when a force is applied to the second switch member SM2. Also, a structure in which, when a touch is applied to the first switch member SM1, parasitic capacitance may be formed in the first substrate 201 between the first switch member SM1 and the first coil element 611 such that a capacitive sensing operation may be available may be included in the example embodiment.

The switching operation sensing device in the example embodiment may include a plurality of switch members, and in this example, the plurality of switch members may be configured to be linearly arranged, or disposed in a matrix form in which the plurality of switch members are arranged horizontally and vertically. In example embodiments, the first and second switch members SM1 and SM2 may be integrated, or integrally formed, with the housing 500. The integrated structure may refer to a single structure in which the switch members may not be mechanically separable from the housing, but the first and second switch members SM1 and SM2 may be integrated with each other as a single body regardless of materials of the elements in a manufacturing process.

The capacitive sensing part CSP and the inductive sensing part ISP illustrated in FIG. 2 are examples, but the example embodiments thereof are not limited thereto.

In the diagrams, unnecessarily overlapped descriptions in relation to the same reference numeral and the same function may not be provided, and differences among the examples in the diagrams will mainly be described.

Figure 3:
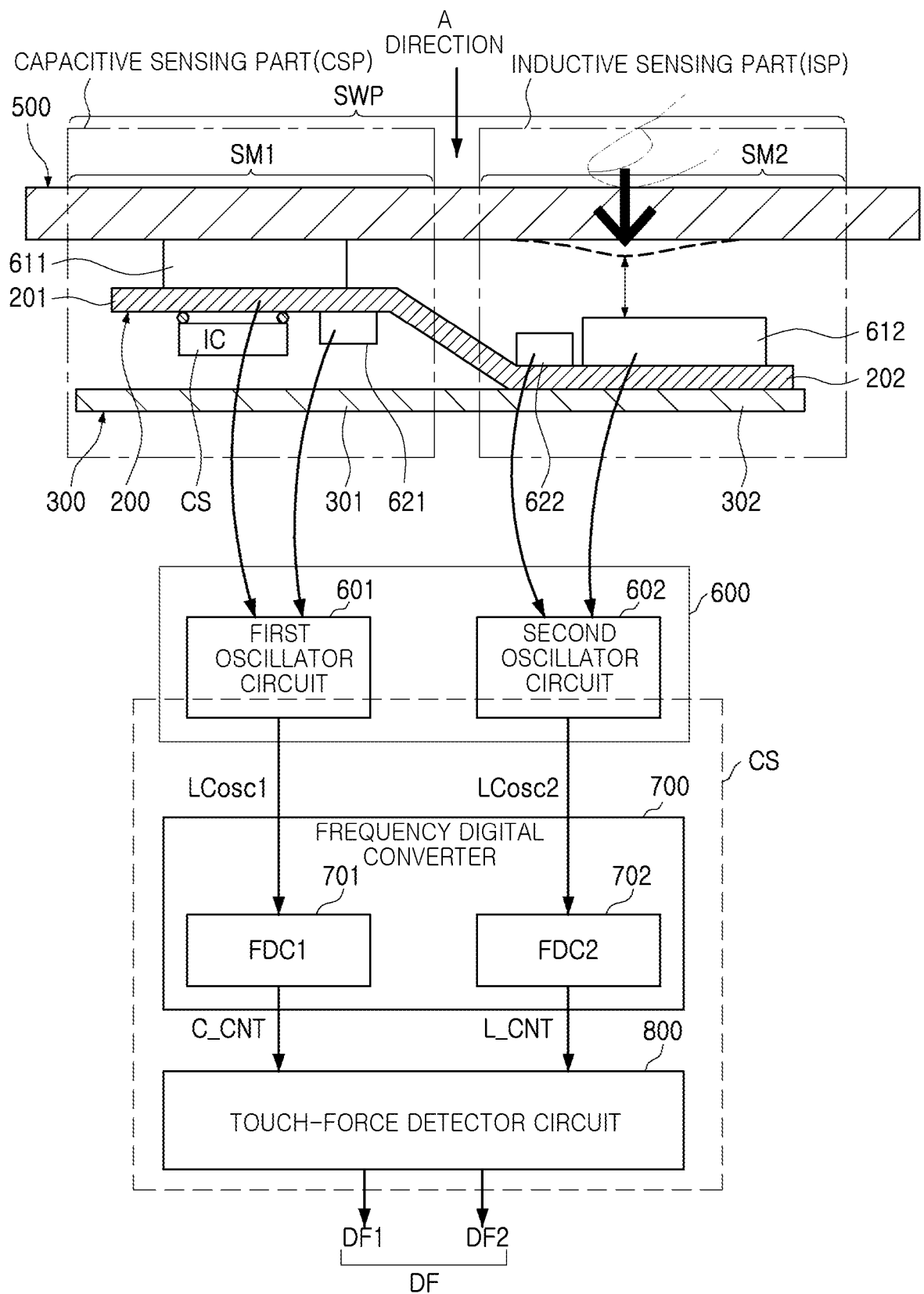
FIG. 3 is a diagram illustrating an example of a switching operation sensing device.

FIG. 3 is a diagram illustrating an example of a switching operation sensing device.

In FIG. 3, a switching operation sensing device in the example embodiment may include a control input unit SWP, an oscillator circuit 600, a frequency digital converter 700, and a tough-force detector circuit 800.

The control input unit SWP may be integrated, or integrally formed, with the housing 500 of a mobile device as described above and may include first and second switch members SM1 and SM2 disposed in different positions.

The oscillator circuit 600 may generate at least one of a first oscillation signal LCosc1 based on capacitance changes when the first switch member SM1 is touched. Another oscillation signal, for example a second oscillation signal LCosc2, may be generated based on inductance changes when an input force is applied to the second switch member SM2.

As an example, the oscillator circuit 600 may include a first oscillator circuit 601 and a second oscillator circuit 602. The first oscillator circuit 601 may generate the first oscillation signal LCosc1 on the basis of capacitance that changes when the first switch member SM1 is touched, and the second oscillator circuit 602 may generate the second oscillation signal LCosc2 on the basis of inductance that changes when a force is applied to the second switch member SM2.

A capacitance circuit 610-1 (in FIG. 4) of the first oscillator circuit 601 may include a first capacitor device 621, and may have a capacitance that changes when a touch is applied by a conductor, a non-conductor, or the like. An inductor circuit 620-1 (in FIG. 4) of the first oscillator circuit 601 may include a first coil element 611 and may have inductance. Accordingly, the first oscillator circuit 601 may generate and output the first oscillation signal LCosc1 having a first resonant frequency that changes on the basis of a touch on the first switch member SM1.

A capacitance circuit 610-2 (in FIG. 4) of the second oscillator circuit 602 may include a second capacitor device 622. An inductance circuit 620-2 (in FIG. 4) of the second oscillator circuit 602 may include a second coil element 612, and may have an inductance that changes when an input force is applied by a conductor or non-conductor, for example. Accordingly, the second oscillator circuit 602 may generate and output the second oscillation signal LCosc2 having a resonant frequency that changes based on an input force (pressure) is applied on the second switch member SM2.

The frequency digital converter 700 may convert the first oscillation signal LCosc1 received from the oscillator circuit 600 to a first count value C_CNT, and may convert the second oscillation signal LCosc2 to a second count value L_CNT.

For example, the frequency digital converter 700 may generate the first count value C_CNT by counting a clock signal using the first oscillation signal, and may generate the second count value L_CNT by counting a clock signal using the second oscillation signal.

As an example, the frequency digital converter 700 may include a first frequency digital converter 701 and a second frequency digital converter 702.

The first frequency digital converter 701 (FDC1) may count a clock signal using the first oscillation signal LCosc1 received from the first oscillator circuit 601 and may convert the first oscillation signal LCosc1 to the first count value C_CNT.

The second frequency digital converter 702 (FDC2) may count a clock signal using the second oscillation signal LCosc2 received from the second oscillator circuit 602 and may convert the second oscillation signal LCosc2 to the second count value L_CNT.

The tough-force detector circuit 800 may detect a touch on the basis of the first count value C_CNT, input from the frequency digital converter 700 and may generate a first detection signal T_DET, and may detect an input force on the basis of the second oscillation signal LCosc2 and may generate a second detection signal F_DF.

In example embodiments, the first and second count values C_CNT and L_CNT may be digital values generated by a count processing operation by processing digital signals, rather than by processing analog signals. Accordingly, the first and second count values C_CNT and L_CNT may not be generated simply by amplification of a signal by an analog amplifier, but may be generated by a count processing operation by the frequency digital converter 700. Such a count processing operation may require a reference clock signal (e.g., a reference frequency signal) and a sample clock signal (e.g., an oscillation signal), and the above-described configured will be described in greater detail later.

Figure 4:
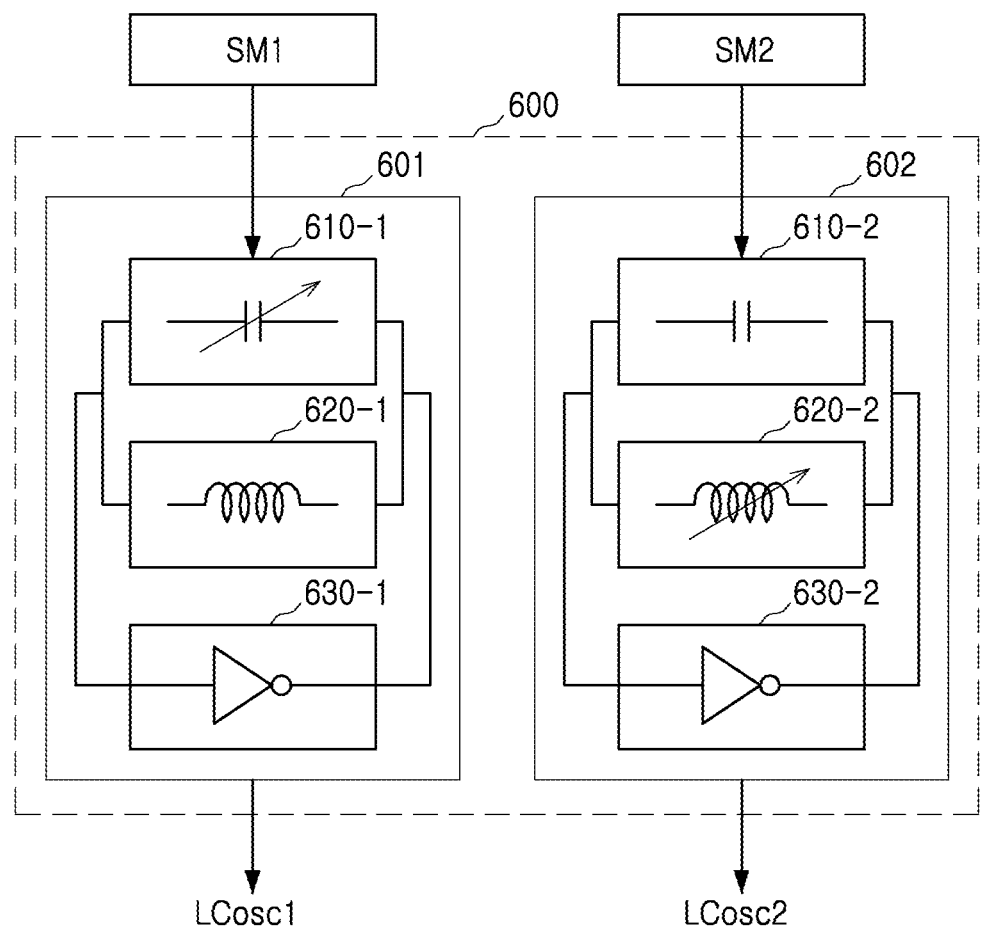
FIG. 4 is a diagram illustrating an example of an oscillator circuit.

FIG. 4 is a diagram illustrating an example of an oscillator circuit.

In FIG. 4, the first oscillator circuit 601 may include a first capacitance circuit 610-1, a first capacitance circuit 620-1, and a first amplifier circuit 630-1.

The first capacitance circuit 610-1 may include a first coil element 611 disposed on an inner side surface of the first switch member SM1 and may include inductance.

The first capacitance circuit 620-1 may include a first capacitor device 621 connected to the inductance circuit 610-1, and may include capacitance that changes when the first switch member SM1 is touched.

The first amplifier circuit 630-1 may generate a first oscillation signal LCosc1 having a first resonant frequency fres1 determined based on the first inductance circuit 610-1 and the first capacitance circuit 620-1. As an example, the first amplifier circuit 630-1 may include at least one inverter, or may include a differential amplifier circuit.

The second oscillator circuit 602 may include a second inductance circuit 610-2, a second capacitance circuit 620-2, and a second amplifier circuit 630-2.

The second inductance circuit 610-2 may include a second coil element 612 spaced apart from an inner side surface of the second switch member SM2, and may include inductance that changes when an input force is applied to the second switch member SM2.

The second inductance circuit 610-2 may include a second capacitor device 622 connected to the second inductance circuit 610-2, and may include capacitance.

The second amplifier circuit 630-2 may generate a second oscillation signal LCosc2 having a second resonant frequency fres2 determined by the second inductance circuit 610-2 and the second inductance circuit 610-2. As an example, the second amplifier circuit 630-2 may include at least one inverter, or may include a differential amplifier circuit.

Figure 5A:
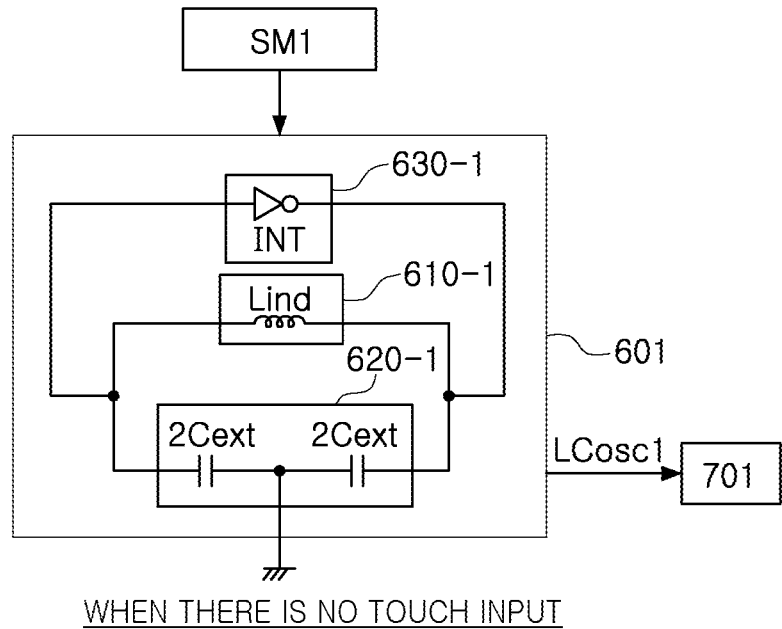
FIG. 5A is a diagram illustrating an example of a first oscillator circuit when there is no touch input.
Figure 5B:
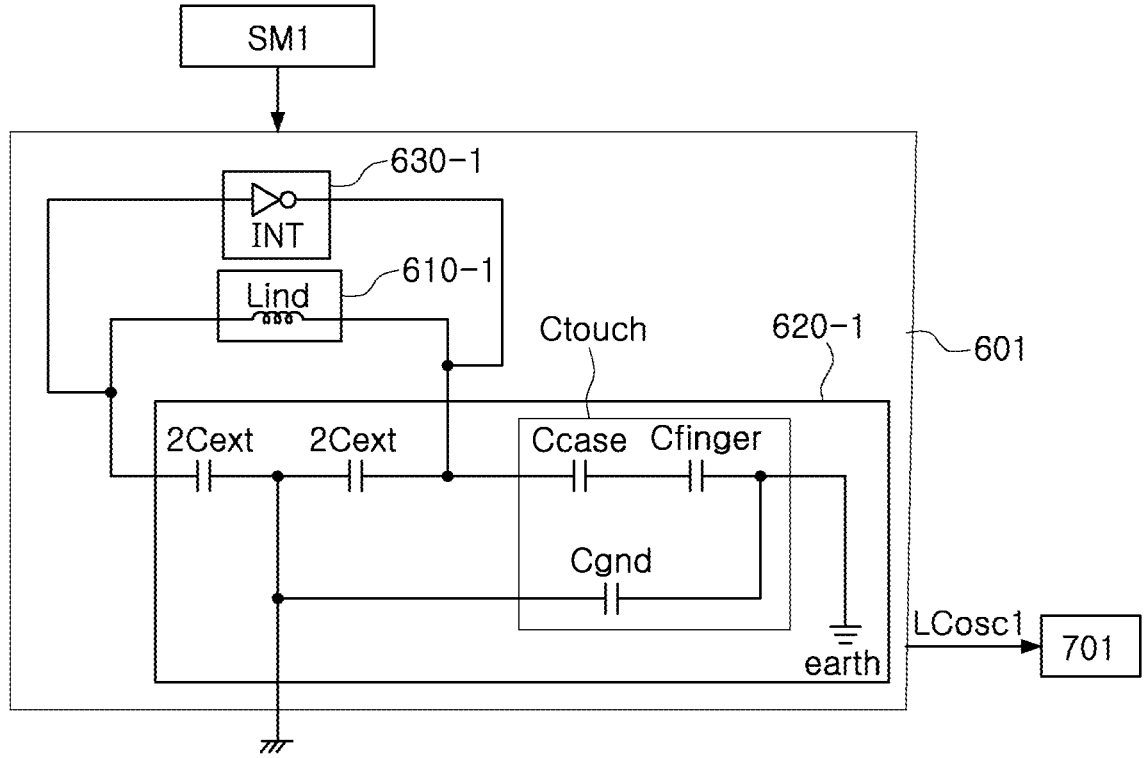
FIG. 5B is a diagram illustrating an example of a first oscillator circuit when a touch is input.

FIG. 5A is a diagram illustrating an example of a first oscillator circuit when there is no touch input, and FIG. 5B is a diagram illustrating an example of a first oscillator circuit when a touch is input.

In the description below, an operation of a first oscillator circuit 601 of when no touch input to a first switch member SM1 will be described with reference to FIG. 5A.

In FIGS. 4 and 5A, the first oscillator circuit 601 may be configured as a parallel LC oscillator circuit that includes a first inductance circuit 610-1 and a first capacitance circuit 620-1. The first inductance circuit 610-1 includes an inductance Lind of a first coil element 611. The first capacitance circuit 620-1 includes a capacitance Cext (2Cext and 2Cext) of a first capacitor device 621.

As an example, the first resonant frequency fres1 of the first oscillator circuit 601 may be represented by Equation 1 as below.

$$\text{freq1} \approx \frac{1}{2\pi} \text{sqrt}(Lind*Cext) \qquad \text{[Equation 1]}$$

In Equation 1, "≈" indicates that the elements may be the same as or similar to each other, and the configuration in which the elements are similar to each other may indicate that another value may be included.

A circuit unit CS may include a portion of the first oscillator circuit 601, a frequency digital converter 700 and a tough-force detector circuit 800, and the circuit unit CS may be implemented in an integrated circuit IC. The first capacitor device 621 may be included in the integrated circuit, or may be disposed as a separate device (e.g., an MLCC) externally.

A resistor (not illustrated) may be connected between the first coil element 611 and the first capacitor device 621, and the resistor may perform an electrostatic discharging function (ESD).

In the example embodiment, the first oscillator circuit 601 may be configured as an LC oscillator circuit, for example, but an example embodiment thereof is not limited thereto. The first oscillator circuit 601 may also be configured as an LC oscillator circuit using capacitance and inductance that change in accordance a touch input by a conductor such as a human hand, or the like.

As illustrated in FIGS. 4 and 5B, when a touch is input by a conductor such as a back of a hand, a first capacitance circuit 620-1 may further include a touch capacitance Ctouch (Ccase, Cfinger, and Cgnd) formed when a touch is input, in addition to the capacitance Cext (2Cext and 2Cext) of the first capacitor device 621.

As an example, the first resonant frequency fres1 of the first oscillator circuit 601 may be represented by Equation 2 as below.

$$\text{fres2} \approx 1/\{2\pi \text{ sqrt}(Lind*[2Cext\|(2Cext+Ctouch)])\}$$

$$Ctouch \approx Ccase\|Cfinger\|Cgnd \qquad \text{[Equation 2]}$$

In Equation 2, "≈" indicates that the elements may be the same or similar to each other, and the configuration in which the elements are similar to each other may indicates that another value may be included. In Equation 2, "Ccase" refers to parasitic capacitance present between the housing and the first coil element 611, "Cfinger" refers to capacitance included in a human body, and "Cgnd" refers to ground return capacitance between a circuit ground and earth.

As for "∥" in Equation 2, "a∥b" indicates that "a" and "b" may be defined as being connected to each other in series in terms of a circuit, and a sum value of the elements may be defined as being calculated as "(a*b)/(a+b)". The above-described definitions may also be applied to the other equations.

Comparing Equation 1 where no touch is input with Equation 2 where a touch is input, as capacitance 2Cext of Equation increases to capacitance (2Cext+Ctouch) of Equation 2, the first resonant frequency fres1 of when no touch is input may decrease to the second resonant frequency fres2 of when a touch is input.

In FIGS. 5A and 5B, the oscillator circuit 600 may generate the first oscillation signal LCosc1 having the first resonant frequency fres1 of when no touch is input and the second oscillation signal LCosc2 having the second resonant frequency fres2 of when a touch is input, and may output the signals to the frequency digital converter 700.

Figure 6A:
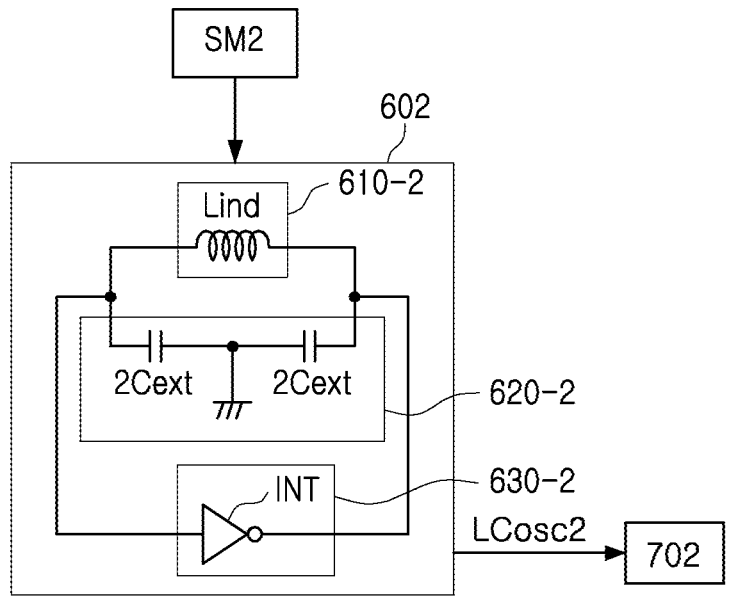
FIG. 6A is a diagram illustrating an example of a second oscillator circuit when no force is input.
Figure 6B:
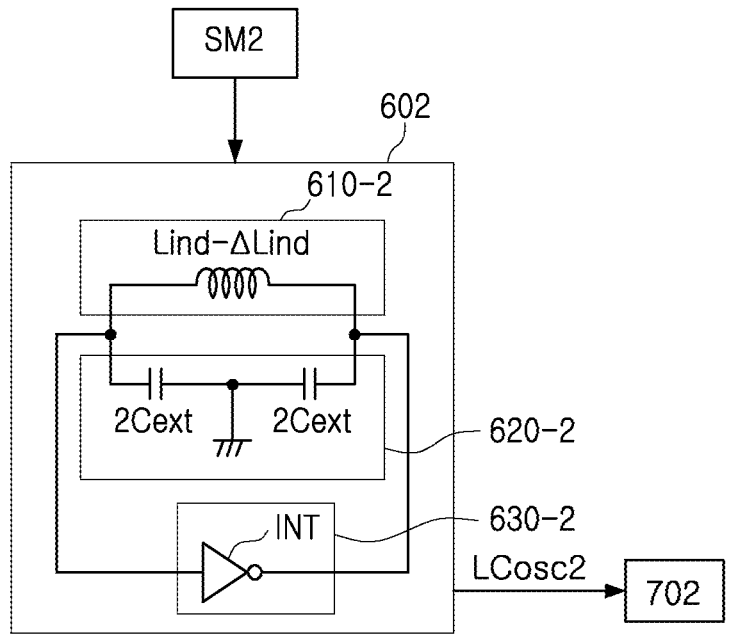
FIG. 6B is a diagram illustrating an example of a second oscillator circuit when an input force is input.

FIG. 6A is a diagram illustrating an example of a second oscillator circuit when no force is input, and FIG. 6B is a diagram illustrating an example of a second oscillator circuit when an input force is applied.

In FIG. 6A, in the example embodiment, when an input force (pressure) of pressing a contact surface of the second switch member SM2 of a housing 500 of a mobile device is applied, an inductive sensing method may be applied, and accordingly, the input force may be detected.

In FIG. 6A, an input force (pressing pressure) by a conductor, a non-conductor, or the like, is input to the second switch member SM2. The second switch member SM2 may be pressured such that the second switch member SM2 may be bent and a gap between the second switch member SM2 and the second coil element 612 may change. Accordingly, while a current flow in the second coil element 612, the distance to the second switch member SM2, an adjacent conductor, may change such that an eddy current may be generated.

In FIG. 6B, inductance generated by the eddy current may decrease from "Lind" in Equation 3 to "Lind−ΔLind" in Equation 4 such that second resonant frequency fres2 may increase as in Equation 4, and accordingly, an input force may be detected.

$$\text{Freq2} \approx \frac{1}{2\pi} \text{sqrt}(Lind*Cext) \qquad \text{[Equation 3]}$$

$$\text{Freq2} \approx \frac{1}{2\pi} \text{sqrt}((Lind-\Delta Lind)*Cext) \qquad \text{[Equation 4]}$$

In Equations 3 and 4, "≈" indicates that the elements may be the same or similar to each other, and the configuration in which the elements are similar to each other may indicates that another value may be included.

As described above, two sensing operations may be available using a duel sensing structure, and a touch and an input force may be detected. The above-described configuration will be described in greater detail in the description below.

Figure 7A:
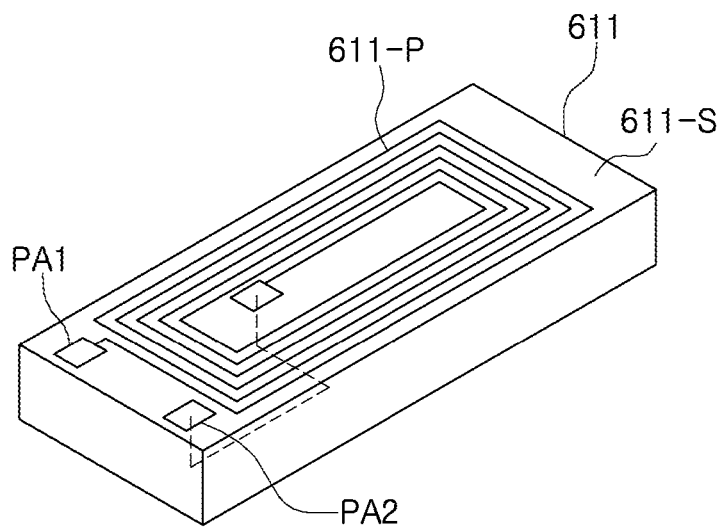
FIGS. 7A and 7B are diagrams illustrating an example of a coil element.
Figure 7B:
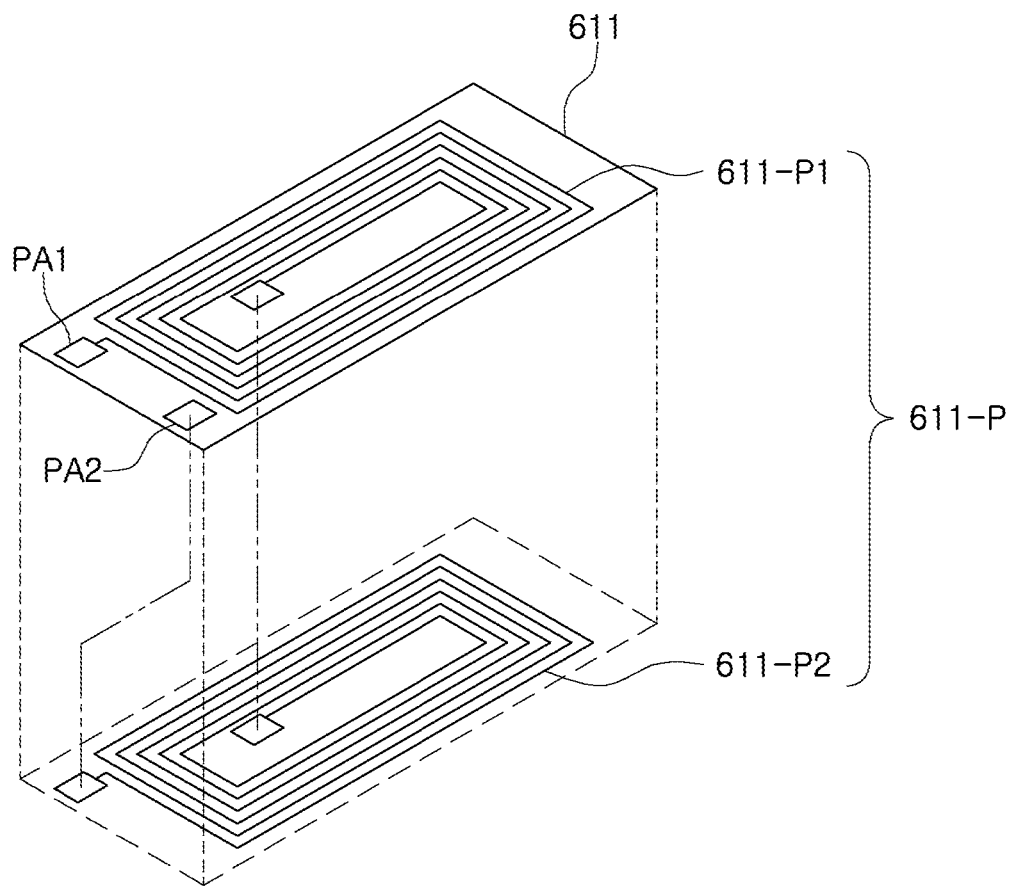

FIGS. 7A and 7B are diagrams illustrating coil elements.

In FIGS. 7A and 7B, a first coil element 611 may be implemented as a PCB coil element configured as a printed circuit board (PCB) pattern.

For example, the first coil element 611 may include a coil pattern 611-P connected between a first pad PA1 and a second pad PA2 as a coil-type pattern, and the coil pattern 611-P may be configured as a PCB pattern.

In FIG. 7A, when a two-surface PCB having a first surface (e.g., an upper surface) and a second surface (e.g., a lower surface) is used, the first pad PA1 and the second pad PA2 may be disposed on the first surface. The first pad PA1 may be connected to an external side terminal of the coil pattern 611-P through the first surface (e.g., an upper surface), and the second pad PA2 may be connected to an inner side terminal of the coil pattern 611-P through a bypass pattern by passing through the second surface (e.g., a lower surface).

As an example, in FIG. 7B, when a two-surface PCB having a first surface (e.g., an upper surface) and a second surface (e.g., a lower surface) is used, the first pad PA1 and the second pad PA2 may be disposed on the first surface. A first coil pattern 611-P1 may be formed on the first surface (e.g., an upper surface) and a second coil pattern 611-P2 may be formed on the second surface (e.g., a lower surface). An inner side terminal of the first coil pattern 611-P1 and the second coil pattern 611-P2 may be connected to each other through a through conductor. An external side terminal of the second coil pattern 611-P2 may be connected to the first pad PA1 and an external side terminal of the second coil pattern 611-P2 may be connected to the second pad PA2 through a through-conductor.

For example, the first coil element 611 may be configured to have various shapes, such as a circular shape, a triangular shape, a rectangular shape, or the like, and the shape is not limited to any particular shape.

The first coil element 611 has been described with reference to FIGS. 7A and 7B, and the second coil element 612 may also be configured to have a structure the same as a structure of the first coil element 611.

In FIGS. 7A and 7B, the first coil element 611 and/or the second coil element 612 may be implemented by a multi-layer PCB having a plurality of layers to be different from the description of a two-surface PCB coil element. In this example, the first surface may be configured as an upper surface of an uppermost layer of the multilayer PCB, and the second surface may be configured as an upper surface of a lowermost layer.

FIGS. 7A and 7B illustrate an example of a PCB coil element having both surfaces, and an example embodiment thereof is not limited thereto. Any PCB coil element which may provide inductance to an oscillator circuit may be used.

Figure 8:
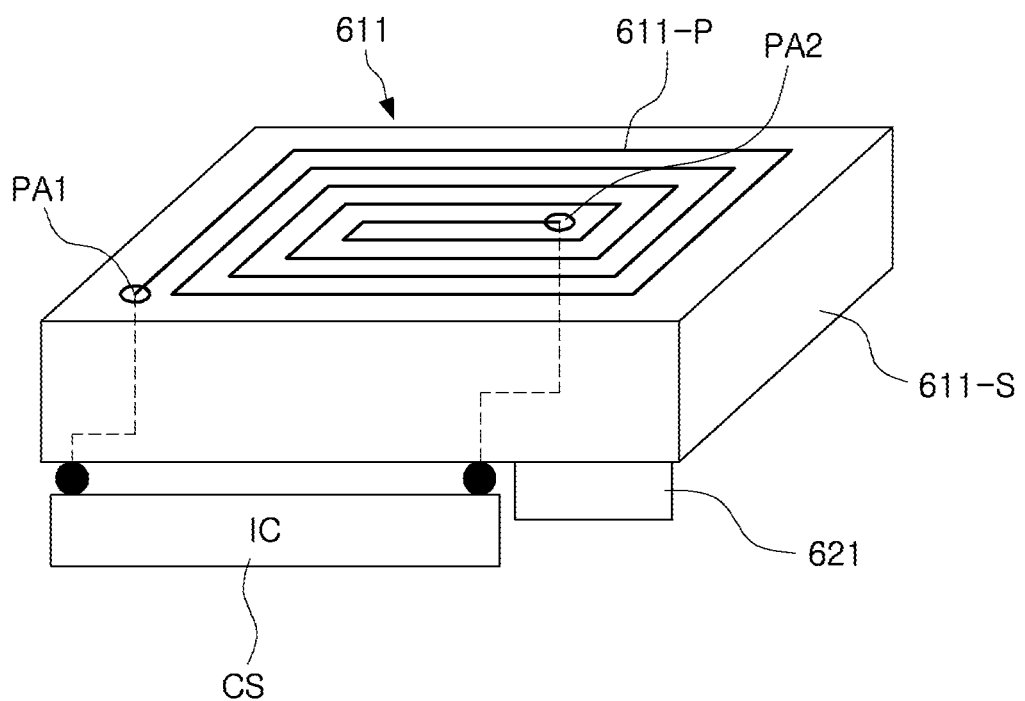
FIG. 8 is a diagram illustrating an example of each of a coil element, an integrated circuit, and a capacitor element.

FIG. 8 is a diagram illustrating an example of each of a coil element, an integrated circuit, and a capacitor element.

In FIG. 8, in the example embodiment, the substrate 200 described in the aforementioned example embodiment may not be provided.

The first coil element 611 may include a multilayer PCB substrate 611-S, including an upper surface opposing the first switch member SM1 (in FIG. 2) and a lower surface opposing the upper surface.

The PCB multilayer substrate 611-S may include a lowermost layer, a middle layer, and an uppermost layer. The lowermost surface may be configured as a lower surface, and the uppermost layer may be configured as an upper surface.

The first coil element 611 may be disposed on an uppermost surface of the PCB multilayer substrate 611-S. The PCB pattern 611-P may include a coil connected between a first pad PA1 and a second pad PA2 disposed on the PCB multilayer substrate 611-S in a coil-type. The coil pattern 611-P may be configured as a PCB. The first pad PA1 and the second pad PA2 may be electrically connected to the oscillator circuit 600.

A capacitance device 621, such as an MLCC and a circuit unit CS, may be disposed on the lowermost surface of the PCB multilayer substrate 611-S.

For example, the first coil element 611 may include a PCB multilayer substrate 611-S and a PCB pattern 611-P disposed on the PCB multilayer substrate 611-S. The PCB pattern 611-P may include a coil connected between a first pad PA1 and a second pad PA2 disposed on the PCB multilayer substrate 611-S in a coil-type.

As an example, the PCB pattern 611-P may be disposed on an upper surface of the PCB multilayer substrate 611-S, and a first capacitor device 621, such as an MLCC and a circuit unit CS may be directly disposed on a lower surface of the PCB multilayer substrate 611-S.

The circuit unit CS, the first capacitor device 621, and the PCB pattern 611-P may be electrically connected to one another through the PCB multilayer substrate 611-S.

Figure 9A:
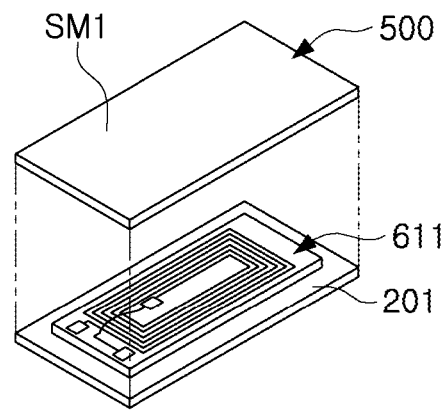
FIGS. 9A, 9B, and 9C are diagrams illustrating an example of arrangement of a coil element illustrated in FIG. 2.
Figure 9B:
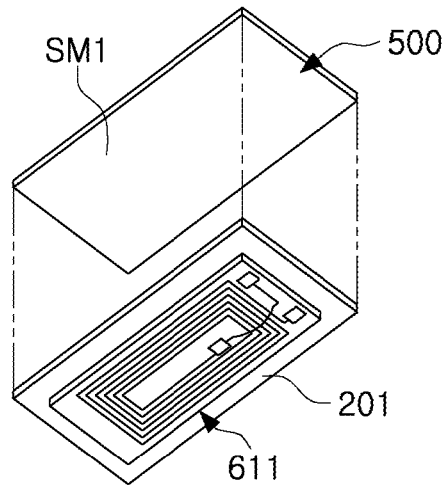
Figure 9C:
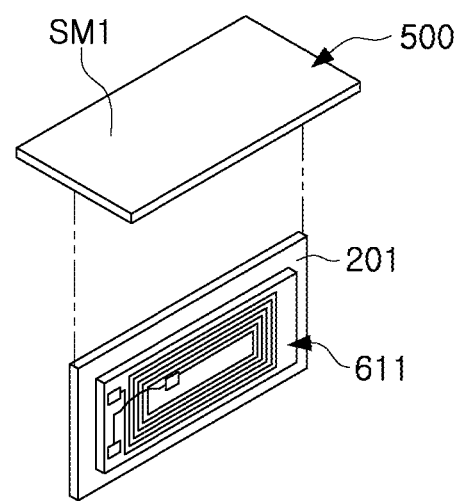

FIGS. 9A, 9B, and 9C are diagrams illustrating an example of an arrangement of a coil element illustrated in FIG. 2.

FIG. 9A is a diagram illustrating an arrangement of a first coil element 611. In FIG. 9A, the first coil element 611 may be disposed on one surface of a first substrate 201 opposing a first switch member SM1. A circuit unit CS (FIG. 2) and a first capacitor device 621 (FIG. 2) may be disposed on the other surface of the first substrate 201 opposing the one surface. The one surface of the first substrate 201 on which the first coil element 611 may oppose an inner side surface of the first switch member SM1 and may be disposed side by side with the inner side surface.

For example, in an x-y-z three-dimensional coordinate system in FIGS. 9A, 9B, and 9C, an x-axis may be defined as a length direction of the first switch member SM1, a y-axis may be defined as a width direction of the first switch member SM1, and z-axis may be defined as an upward direction of the first switch member SM1.

In the three-dimensional coordinate system, the first substrate 201 and the first switch member SM1 may be spaced apart from each other and may be disposed on an x-y planar surface.

FIG. 9B is a diagram illustrating another example of an arrangement of the first coil element 611. In FIG. 9B, the first coil element 611 may be disposed on one surface of a first substrate 201 opposite to the other surface of the first substrate 201 opposing the first switch member SM1, and the circuit unit CS (in FIG. 2) and a first capacitor device 621 (in FIG. 2) may be disposed on the other surface of the first substrate 201 opposing the first switch member SM1. The other surface of the first substrate 201 on which the first coil element 611 is disposed may oppose an inner side surface of the first switch member SM1 and may be disposed side by side with the inner side surface.

In the three-dimensional coordinate system, the first substrate 201 and the first switch member SM1 may be spaced apart from each other and may be disposed on an x-y planar surface.

FIG. 9C is a diagram illustrating another example of the first coil element 611 illustrated in FIG. 2. In FIG. 9C, the first coil element 611 may be disposed on one surface of the first substrate 201, and the circuit unit CS (in FIG. 2) and the first capacitor device 621 (in FIG. 2) may be disposed on the other surface of the first substrate 201. As an example, the first substrate 201 on which the first coil element 611 is disposed may be disposed substantially perpendicularly to the first switch member SM1, rather than being disposed side by side with the first switch member SM1.

In the three-dimensional coordinate system, the first substrate 201 and the first switch member SM1 may be spaced apart from each other, the first switch member SM1 may be disposed on the x-y planar surface, and the first substrate 201 may be disposed on an x-z planar surface.

In FIGS. 9A, 9B, and 9C, the first substrate 201 on which the first coil element 611 is disposed may be disposed in various postures with respect to the first switch member SM1. Accordingly, the arrangement posture of the first substrate 201 may not be limited to the examples illustrated in FIGS. 9A, 9B, and 9C. The arrangement posture may not be limited to any particular example as long as a resonant frequency is able to change on the basis of changes in capacitance caused by a touch.

Figure 10:
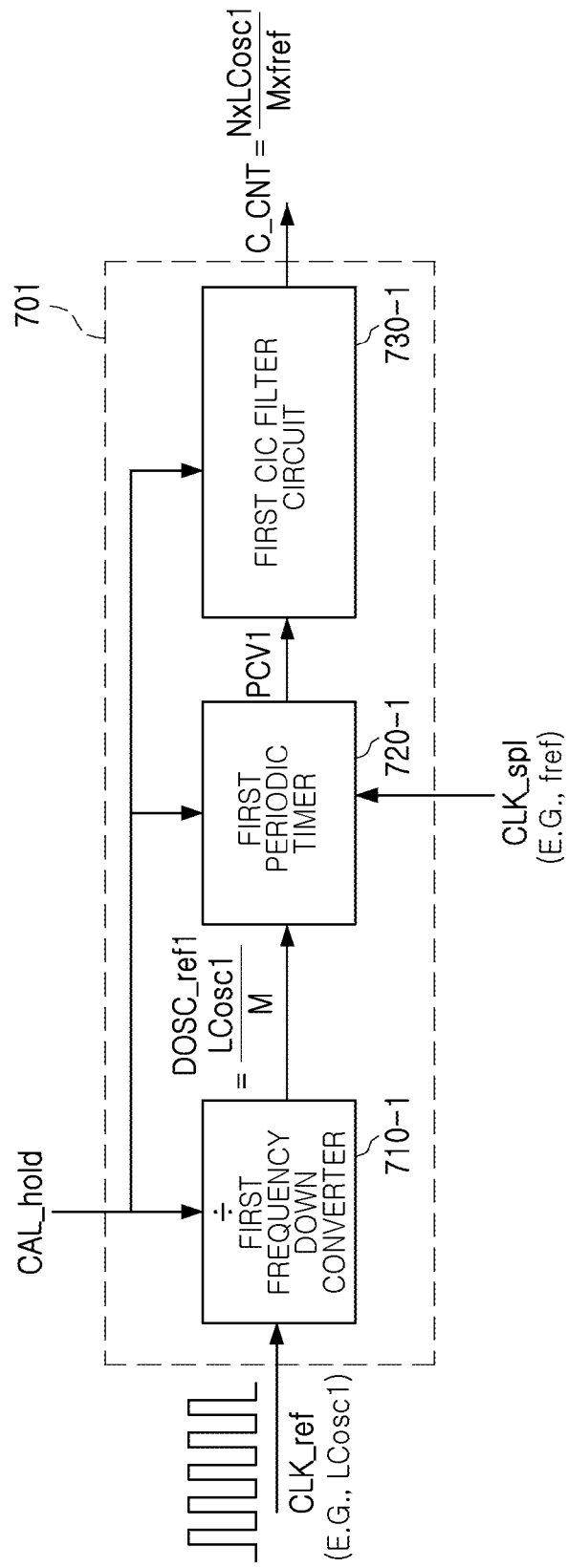
FIG. 10 is a diagram illustrating an example of a first frequency digital converter.

FIG. 10 is a diagram illustrating an example of a first frequency digital converter.

In FIG. 10, a first frequency digital converter 701 (FDC1) may include a first frequency down converter 710-1, a first periodic timer 720-1, and a first cascaded integrator-comb (CIC) filter circuit 730-1.

The first frequency down converter 710-1 may receive a reference clock CLK_ref, configured as a reference of a time period of the first periodic timer 720-1, and may down-convert a frequency of the reference clock CLK_ref.

For example, the reference clock CLK_ref input to the first frequency down converter 710-1 may be configured as one of a first oscillation signal LCosc1 and a reference signal fref. As an example, when the reference clock CLK_ref is configured as the first oscillation signal LCosc1, a frequency of the first oscillation signal LCosc1 may be down-converted as in "DOSC_ref1=LSosc1/M," and "M" may be externally set in advance. As another example, when the reference clock CLK_ref is configured as the reference signal fref, a frequency of the reference clock CLK_ref may be down-converted as in "DOSC_ref1=fref/N", and "N" may be externally set in advance.

The first periodic timer 720-1 may output a first period count value PCV1 generated by counting a single period time of the firstly divided reference clock signal DOSC_ref1 received from the first frequency down converter 710-1 using the sample clock CLK_spl (e.g., the first oscillation signal LCosc1.

As an example, the first CIC filter circuit 730-1 may output the first count value C_CNT generated by performing accumulative amplification for the first period count value PCV1 received from the first periodic timer 720-1.

As an example, the first CIC filter circuit 730-1 may include a decimator CIC filter.

As an example, the decimator CIC filter may output the first count value C_CNT generated by performing accumulative amplification for the first period count value PCV1 received from the first periodic timer 720-1. For example, the decimator CIC filter may perform accumulative amplification for the first period count value received from the first periodic timer using an accumulative gain determined by a predetermined integration stage order, a decimator factor, and a comb-differentiation delay order, and may provide the accumulative-amplified first period count value.

As another example, the first CIC filter circuit 730-1 may further include a primary CIC filter. The primary CIC filter may remove noise by obtaining a moving average of an output from the decimator CIC filter.

For example, the decimator CIC filter may perform accumulative amplification for the received first period count value PCV1 using an accumulative gain and may output the first count value C_CNT as in Equation 3.

$$C\_CNT=(N*LCosc1)/(M*fref) \quad [\text{Equation 3}]$$

In Equation 3, "LCosc1" may be a frequency of the first oscillation signal, "fref" may be a reference frequency, "N" may be a divide ratio of a reference frequency (e.g., 32 Khz), and "M" may be a divide ratio of a sensing resonant frequency.

As indicated in Equation 2, the configuration in which the first oscillation signal LCosc1 is divided by the reference frequency fref may indicate that a period of the reference frequency fref may be counted using the first oscillation signal LCosc1. When the first count value C_CNT is obtained by the method described above, a relatively low reference frequency fref may be used, and the accuracy of the counting may increase.

For example, when the decimator CIC filter includes an integration circuit, a decimator, and a differentiation circuit, the accumulative gain may be obtained as in $[(R*M)^S]$ on the basis of a stage order S of the integration circuit, a decimator factor R, and a delay order M of the differentiation circuit. As an example, when the stage order S of the integration circuit is 4, the decimator factor R is 1, and the delay order M of the differentiation circuit is 4, the accumulative gain may be $256[(1*4)^4]$.

Figure 11:
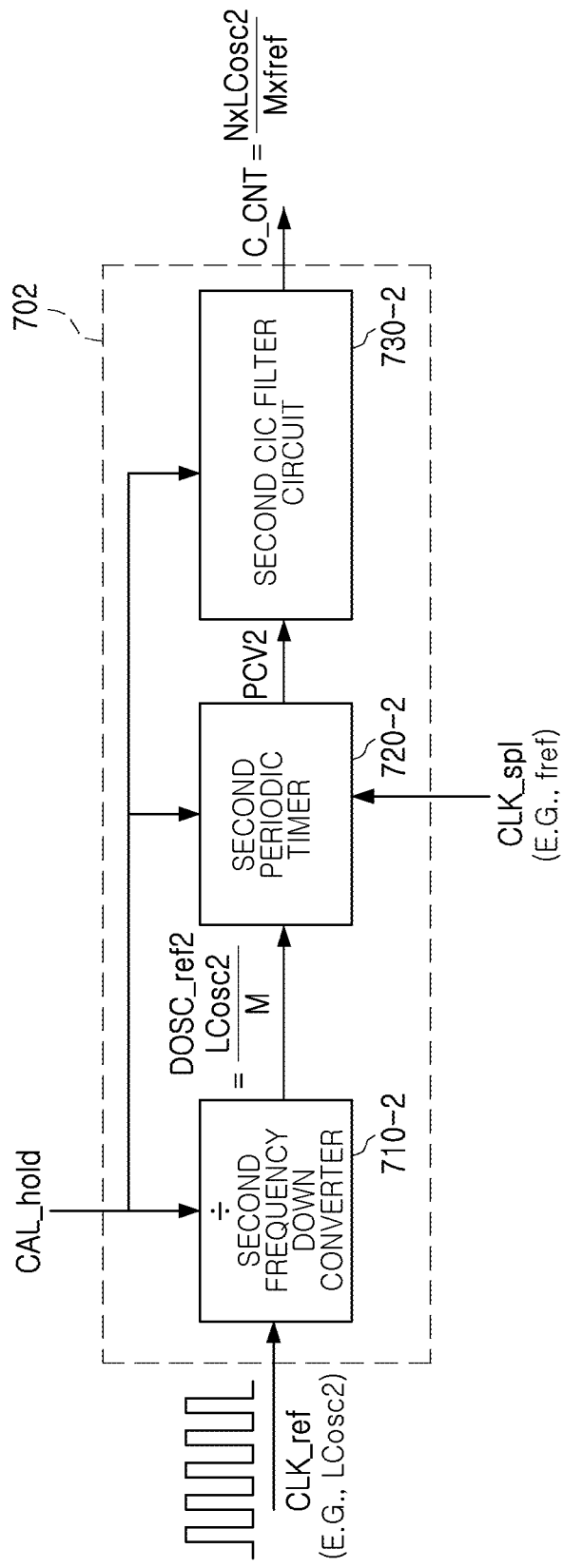
FIG. 11 is a diagram illustrating an example of a second frequency digital converter.

FIG. 11 is a diagram illustrating an example of a second frequency digital converter.

In FIG. 11, a second frequency digital converter 702 (FDC2) may include a second frequency down converter 710-2, a second periodic timer 720-2, and a second cascaded integrator-comb (CIC) filter circuit 730-2.

The second frequency down converter 710-2 may perform an operation the same as an operation of the first frequency down converter 710-1 illustrated in FIG. 6. As an example, the second frequency down converter 710-2 may generate a secondly divided reference clock signal (DOSC_ref2=fref/N) obtained by dividing a reference frequency fref using a reference frequency divide ratio N.

The second periodic timer 720-2 may perform an operation the same as an operation of the first periodic timer 720-1 illustrated in FIG. 11. As an example, the second periodic timer 720-2 may output a second period count value PCV2 generated by counting a single period time of a secondly divided reference clock signal DOSC_ref2 received from the second frequency down converter 710-2 using a second oscillation signal LCosc2.

The second CIC filter circuit 730-2 may perform an operation the same as an operation of the first CIC filter circuit 730-1 illustrated in FIG. 11. As an example, the second CIC filter circuit 730-2 may output the second count value L_CNT generated by performing accumulative amplification for the second period count value PCV2 received from the second periodic timer 720-2.

Figure 12:
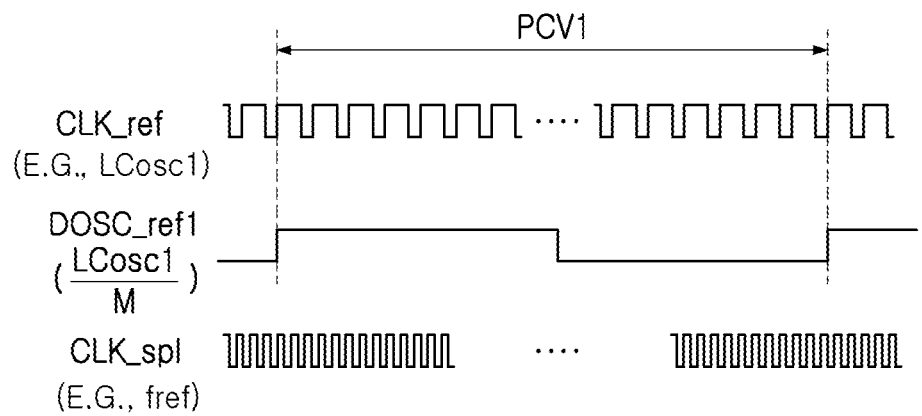
FIG. 12 is a diagram illustrating operations of a first periodic timer illustrated in FIG. 10.

FIG. 12 is a diagram illustrating operations of a first periodic timer illustrated in FIG. 10.

In FIG. 12, as described above, a reference clock CLK_ref may be configured as one of a first oscillation signal LCosc1 and a reference frequency signal fref. The reference frequency signal fref may be configured as a signal by an external crystal, and may be configured as an oscillation signal of a PLL or an RC in an IC.

As an example, when the reference clock CLK_ref is the first oscillation signal LCosc1 input from a first oscillator circuit 601, a sample clock CLK_spl may become the reference signal fref. An oscillation signal divided when the first oscillation signal LCosc1 is divided by a divide ratio M may be "LCosc1/M."

When the reference clock CLK_ref is the reference signal fref, the sample clock CLK_spl may become the first oscillation signal LCosc1, and in this case, the divided reference signal may be "fref/N."

Figure 13:
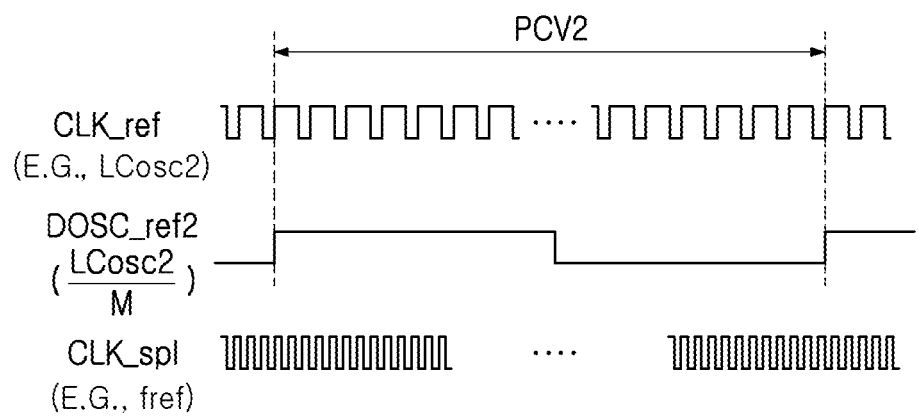
FIG. 13 is a diagram illustrating operations of a second periodic timer illustrated in FIG. 11.

FIG. 13 is a diagram illustrating operations of a second periodic timer illustrated in FIG. 12.

In FIG. 13, as described above, a reference clock CLK_ref may be configured as one of a second oscillation signal LCosc2 and a reference frequency signal fref.

As an example, when the reference clock CLK_ref is the second oscillation signal LCosc2 input from the second oscillator circuit 602, a sample clock CLK_spl may become a reference signal fref, and an oscillation signal divided when the second oscillation signal LCosc2 is divided by a divide ratio M may be "LCosc2/M."

When the reference clock CLK_ref is the reference signal fref, the sample clock CLK_spl may become the second oscillation signal LCosc2, and in this case, the divided reference signal may be "fref/N."

Figure 14:
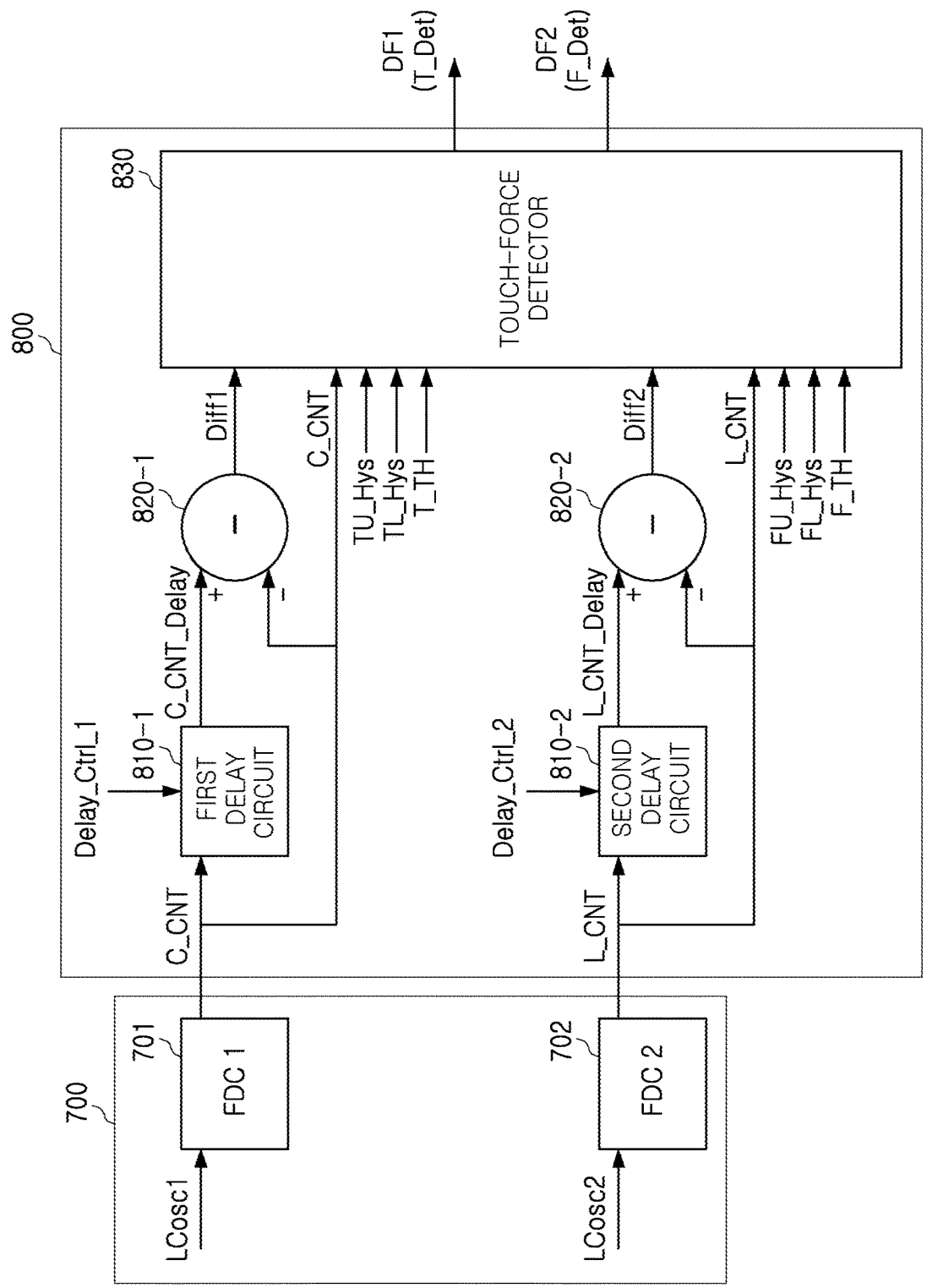
FIG. 14 is a diagram illustrating an example of a touch detector.

FIG. 14 is a diagram illustrating an example of a touch detector.

In FIG. 14, a touch-force detector circuit 800 may generate first and second differential values Diff1 and Diff2 by differentiating a first count value C_CNT and a second count value L_CNT received from a frequency digital converter 700, respectively, may compare the first and second differential values Diff1 and Diff2 with a predetermined touch threshold value T_TH and a predetermined force threshold value F_TH, respectively, and may output a first detection signal T_Det corresponding to a touch or a second detection signal F_Det corresponding to an input force on the basis of a result of the comparison.

For example, in FIG. 14, the touch-force detector circuit 800 may include a first delay circuit 810-1, a second delay circuit 810-2, a first subtraction circuit 820-1, a second subtraction circuit 820-2, and a touch-force detector 830.

The first delay circuit 810-1 may output a first delay count value C_CNT_Delay generated by delaying the first count value C_CNT received from the first frequency digital converter 701 by a time determined by a first delay control signal Delay_Ctrl.

The second delay circuit 810-2 may output a second delay count value L_CNT_Delay generated by delaying the second count value L_CNT received from the second frequency digital converter 702 by a time determined by a second delay control signal Delay_Ctr2. A delay time may be determined in accordance with the second delay control signal Delay_Ctr2.

The second subtraction circuit 820-2 may output a first differential value Diff1 generated by subtracting the first count value C_CNT from the first delay count value C_CNT_Delay received from the first delay circuit 810-1. The first differential value Diff1 may be a change of a slope of the first count value C_CNT. The first count value C_CNT may be a currently counted value, and the first delay count value C_CNT_Delay may be a value counted before a particular delay time.

The second subtraction circuit 820 may output a second differential value Diff2 generated by subtracting the second count value L_CNT from the second delay count value L_CNT_Delay received from the second delay circuit 810-2. The second differential value Diff2 may be a change of a slope of the second count value L_CNT. The second count value L_CNT may be a currently counted value, and the second delay count value L_CNT_Delay may be a value counted before a particular delay time.

The touch-force detector 830 may compare the first differential value Diff1 and the second differential value Diff2 with a predetermined touch threshold value T_TH and a predetermined force threshold value F_TH, respectively. The touch-force detector 830 may output a first detection signal T_Det having a first level corresponding to a touch and a second detection signal F_Det having a second level corresponding to force on the basis of a result of the comparison.

For example, the touch-force detector 830 may compare the first differential value Diff1 related to a touch slope output from the first subtraction circuit 820-1 with touch sections T_TH, TU_Hys, and TL_Hys. When the first differential value Diff1 is smaller than the touch sections T_TH, TU_Hys, and TL_Hys, the touch-force detector 830 may recognize an input as a touch, and may output a first detection signal (DF1: Detect_Flag1)(T_Det) having a high level. Differently from the above configuration, when the first differential value Diff1 is greater than the touch sections T_TH, TU_Hys, and TL_Hys, the touch-force detector 830 may recognize that no touch is input, and may output a first detection signal (DF1)(T_Det) having a low level.

In the touch sections T_TH, TU_Hys, and TL_Hys, "T_TH" may be a touch threshold value, and "TU_Hys" and "TL_Hys" may be an upper limit value and a lower limit value of a touch hysteresis. When an upper limit value and a lower limit value of touch hysteresis are used, a touch may be determined with reference to an upper limit value of touch hysteresis, and a touch release may be determined with reference to a lower limit value of touch hysteresis.

Also, the touch-force detector 830 may compare the second differential value Diff2 related to a force slope output from the second subtraction circuit 820-2 with force sections F_TH, FU_Hys, and FL_Hys, and when the second differential value Diff2 is lower than the force sections F_TH, FU_Hys, and FL_Hys, the touch-force detector 830 may recognize that no force is input, and may output a second detection signal DF2: Detect_Flag2)(F_Det) having a low level. When the second differential value Diff2 is greater than the force sections F_TH, FU_Hys, and FL_Hys, the touch-force detector 830 may recognize that an input is an input force, and may output a detection signal (DF2)(F_Det) having a high level.

In the force sections F_TH, FU_Hys, and FL_Hys, "F_TH" may be a force threshold value, and "FU_Hys" and "FL_Hys" may be an upper limit and a lower limit of a force hysteresis, respectively. When an upper limit and a lower limit of a force hysteresis are used, an input force may be determined with reference to an upper limit of a force hysteresis, and a force release may be determined with reference to a lower limit of a force hysteresis.

When the first and second differential values Diff1 and Diff2 related to a slope are used, an error associated with a temperature drift may be prevented. Also, when the touch sections T_TH, TU_Hys, and TL_Hys and the force sections F_TH, FU_Hys, and FL_Hys are used, the accuracy of a sensing operation may improve.

Figure 15:
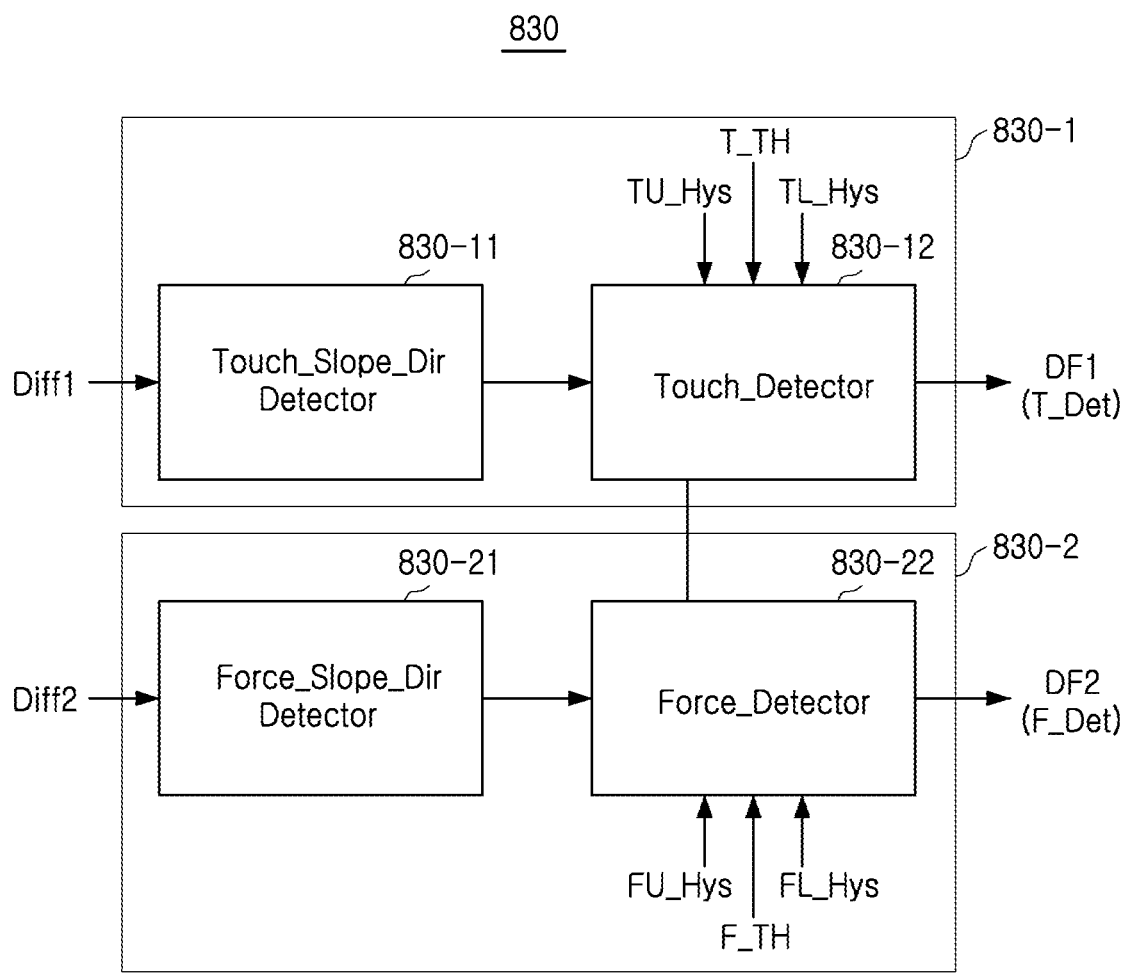
FIG. 15 is a diagram illustrating an example of a touch-force detector circuit.

FIG. 15 is a diagram illustrating an example of a touch-force detector circuit.

In FIGS. 14 and 15, a touch-force detector 830 may include a touch detector circuit 830-1 and a force detector circuit 830-2.

The touch detector circuit 830-1 may compare a first differential value Diff1 with a predetermined touch threshold value T_TH, and may output a first detection signal T_Det having a first level corresponding to a touch on the basis of a result of the comparison.

The force detector circuit 830-2 may compare a second differential value Diff2 with a predetermined force threshold value F_TH, and may output a second detection signal F_Det having a second level corresponding to an input force on the basis of a result of the comparison.

As an example, the touch detector circuit 830-1 may include a touch slope direction detector 830-11 and a touch detector 830-12. The force detector circuit 830-2 may include a force slope direction detector 830-21 and a force detector 830-22.

As an example, the touch slope direction detector 830-11 may detect a degree and a direction of a touch slope. On the basis of the degree and the direction of the touch slope detected by the touch slope direction detector 830-11, when a direction of a touch slope is a downward direction (−direction), the touch detector 830-12 may compare the first differential value Diff1, a degree of the touch slope, with a touch upper limit value TU_Hys. When the differential value Diff1 is higher than the touch upper limit value TU_Hys, the touch detector 830-12 may recognize a touch. After recognizing a touch, when a direction of the touch slope is an upward direction (+direction), the touch detector 830-12 may compare the first differential value Diff1, a degree of the touch slope, with a touch lower limit value TL_Hys, and when the first differential value Diff1 is higher than a touch lower limit value TL_Hys, the touch detector 830-12 may determine that a touch is released.

As described above, to secure stability along with the touch threshold value T_TH, the touch hysteresis upper limit TU_Hys and the touch hysteresis lower limit TL_Hys may be determined to be close to the threshold value.

The force slope direction detector 830-21 may detect a degree and a direction of a force slope. On the basis of the degree and the direction of the force slope detected by the force slope direction detector 830-21, when a direction of a force slope is an upward direction (+direction), the force detector 830-22 may compare the second differential value Diff2, a degree of the force slope, with a force upper limit value FU_Hys. When the second differential value Diff2 is higher than the force upper limit value FU_Hys, the force detector 830-22 may recognize an input force. After recognizing an input force, when a direction of the force slope is a downward direction (−direction), the force detector 830-22 may compare the second differential value Diff2, a degree of the force slope, with a force lower limit value FL_Hys. When the second differential value Diff2 is higher than the force lower limit value FL_Hys, the force detector 830-22 may determine that a force is released. As described above, to secure stability along with the force threshold value F_TH, the force hysteresis upper limit FU_Hys and the force hysteresis lower limit FL_Hys may be determined to be close to the threshold value.

Figure 16:
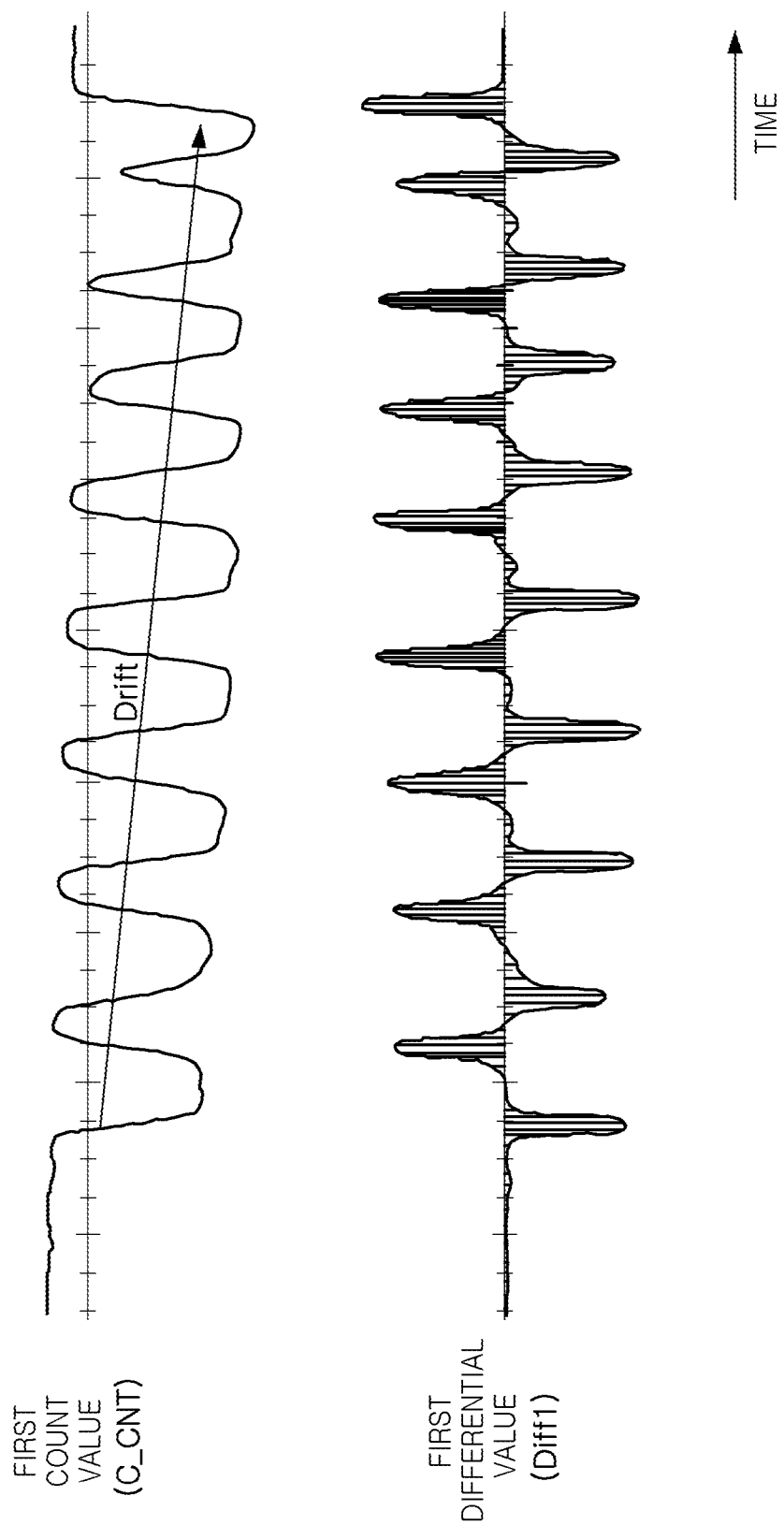
FIG. 16 is a diagram illustrating changes in drift and slope of a count value of when a touch (e.g., a hand-touch) is input.

FIG. 16 is a diagram illustrating changes in drift and slope of a sensing count value of when a touch (e.g., a hand-touch) is input.

In FIG. 16, when a first switch member SM1 (in FIG. 2) is continuously contacted (touched), a decreasing drift of a first count value C_CNT may occur due to a change in temperature of a first coil element 611 (in FIG. 2) through the first switch member SM1 (in FIG. 2). Thus, to determine the contact, the effect of the temperature drift may be prevented by using a slope change, rather than using an absolute counter level.

Accordingly, a change of a slope in an initial state, caused by a contact by a human hand, or the like, may be determined on the basis of a state before sensing a change higher than an increasing threshold value after sensing a change lower than a decreasing threshold value.

Figure 17:
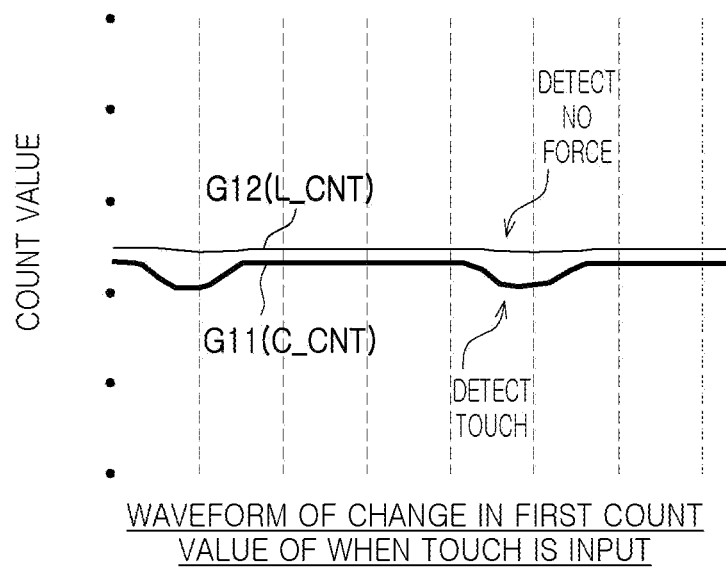
FIG. 17 is a diagram illustrating first and second count values of when only a touch is input.
Figure 18:
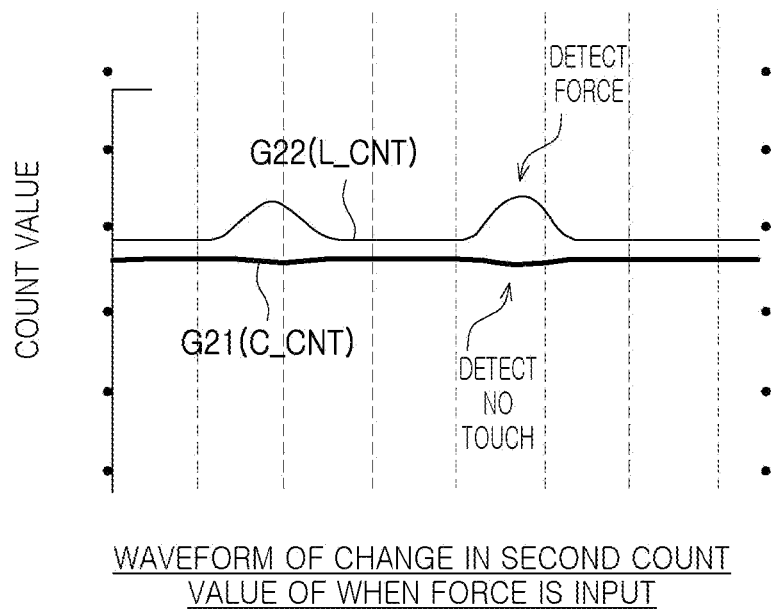
FIG. 18 is a diagram illustrating first and second count values of when only an input force is input.
Figure 19:
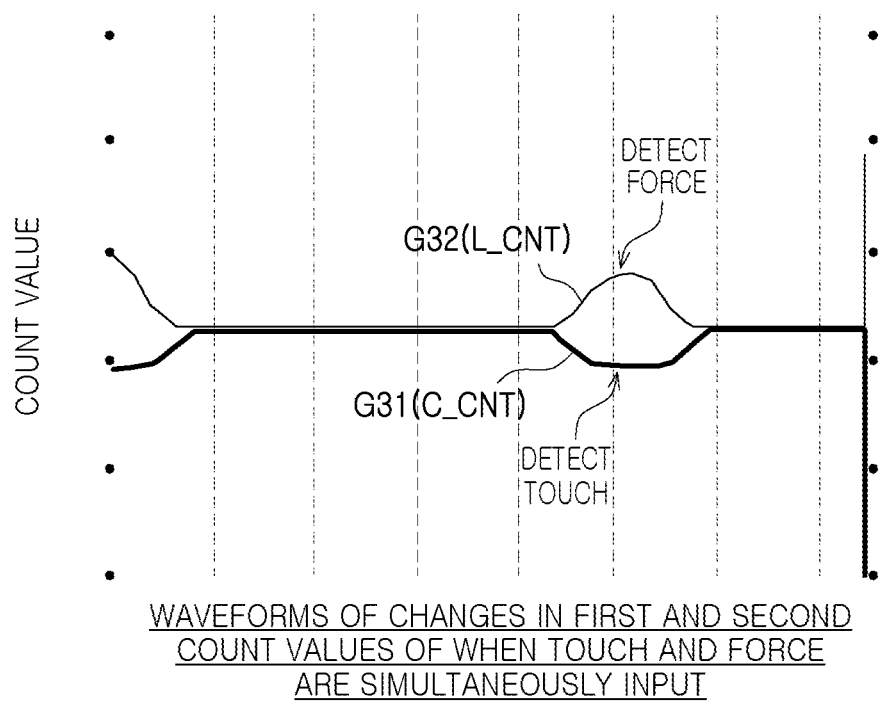
FIG. 19 is a diagram illustrating a sensing count value of when a touch and an input force (touch+force) are input.

FIG. 17 is a diagram illustrating first and second count values of when only a touch is input. FIG. 18 is a diagram illustrating first and second count values of when only an input force is input. FIG. 19 is a diagram illustrating a sensing count value of when a touch and an input force (touch+force) are input.

In FIGS. 17 to 19, a method for distinguishing a touch and an input force from each other using first and second coil elements 611 and 612 will be as follows.

A waveform measured when a conductor, such as a back of a human hand, touches a first switch member SM1 integrated, or integrally formed, with a housing or a metal case, may be as in FIG. 17. A waveform of when a conductor or a non-conductor applies only an input force on a second switch member SM2 may be as in FIG. 18. Also, when a conductor such as a hand, or the like, presses the first switch member SM1 and the second switch member SM2 by force while touching the first switch member SM1 and the second switch member SM2, a touch and an input force may be simultaneously sensed, and a waveform of the above-described operation may be as in FIG. 19.

In FIG. 17, "G11" may be a first count value C_CNT, and "G12" may be a second count value L_CNT. As indicated, when only a touch is applied to the first switch member SM1, the first switch member SM1 may operate by a capacitive method such that the first count value C_CNT may decrease, and that, when a hand is taken off, the first count value C_CNT may increase to an original value. Accordingly, when a slope value is identified on the basis of the above-described operation, a slope value may decrease when a touch is input, and a slope value may increase when there is no touch.

Differently from the above-described configuration, "G21" may be the first count value C_CNT, and "G22" may be the second count value L_CNT. When only an input force is applied to the second switch member SM2, the second switch member SM2 may operate by an inductive method such that the second count value L_CNT may increase, and when an input force is removed, the second count value L_CNT may decrease to an original value.

In FIG. 19, "G31" may be the first count value C_CNT, and "G32" may be the second count value L_CNT. When both a touch and an input force are simultaneously applied to the first and second switch members by a conductor such as the back of a human hand, and an input force (pressure) is applied while touching the switch members as in the waveform illustrated in FIG. 19, a first counter value G31 may decrease by the touch gesture (a capacitive method) and the housing may be bent by the pressure such that the touch and the force may be simultaneously sensed by an increase (an inductive method) of the second counter value G32 generated by a decrease of a distance between the housing and the second coil element.

Figure 20:
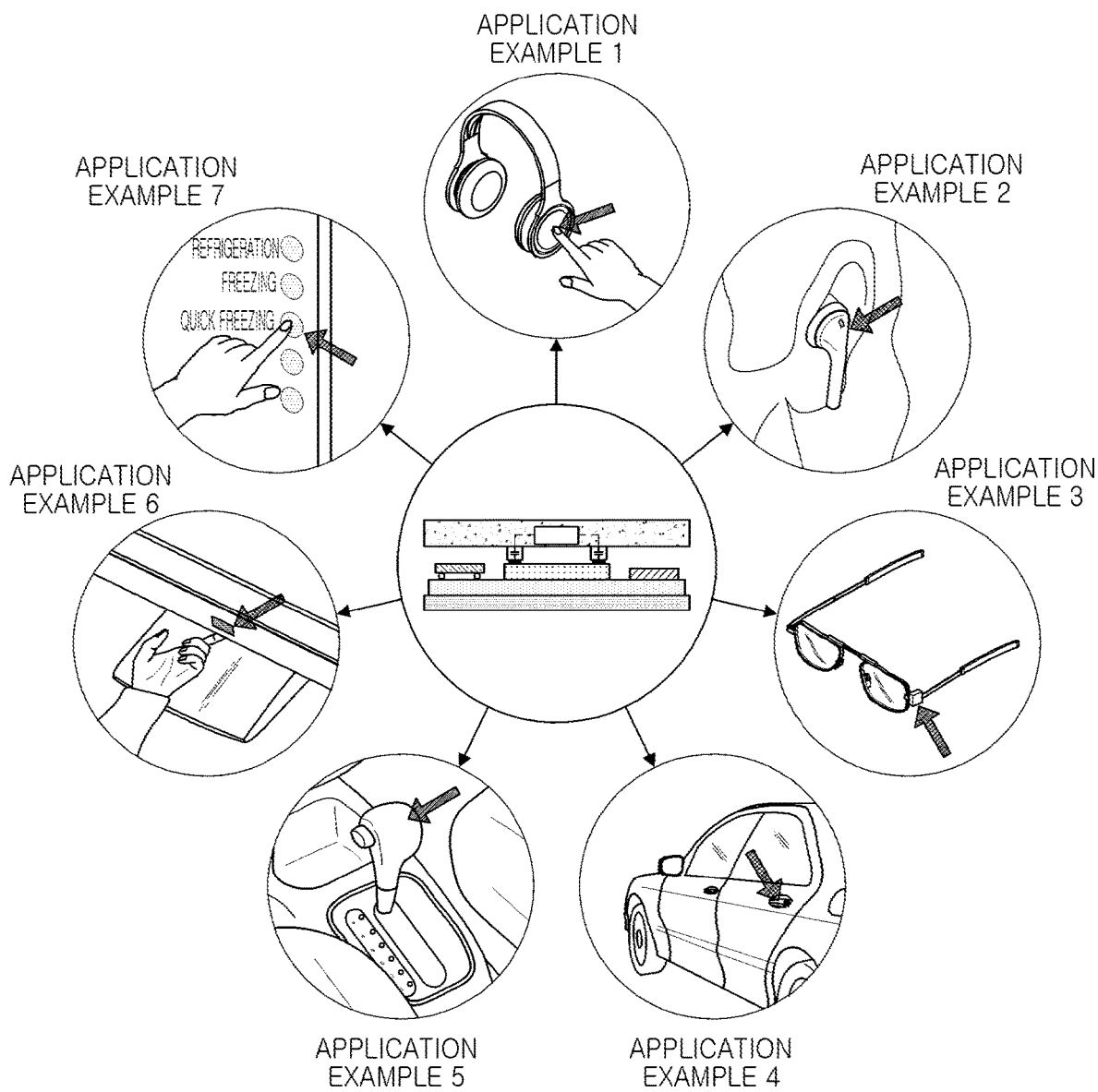
FIG. 20 is a diagram illustrating an example of application of a switching operation sensing device.

FIG. 20 is a diagram illustrating examples of applications of a switching operation sensing device.

FIG. 20 illustrates a plurality of application examples 1 to 7 of a switching operation sensing device described in the example embodiments.

Application example 1 in FIG. 20 indicates an example of a switching operation sensing device that may replace a button for controlling an operation of a Bluetooth headset. Application example 2 in FIG. 20 indicates an example of a switching operation sensing device that may replace a button for controlling an operation of a Bluetooth earphone. As an example, the switching operation sensing device may replace an on/off power switch of a Bluetooth headset and Bluetooth earphones.

Application example 3 in FIG. 20 indicates an example of a switching operation sensing device that may replace a button for controlling an operation of glasses. As an example, the switching operation sensing device may replace a button for performing functions of calling, mailing, a home button, and the like, of devices such as Google Glass, VR, AR, and the like.

Application example 4 in FIG. 20 indicates an example of a switching operation sensing device that may replace a doorlock button of a vehicle. Application example 5 in FIG. 20 indicates an example of a switching operation sensing device that may replace a button of a smart key of a vehicle. Application example 6 in FIG. 20 indicates an example of a switching operation sensing device that may replace a button for controlling an operation of a computer. Application example 7 in FIG. 20 indicates an example of a switching operation sensing device that may replace a button for controlling an operation of a refrigerator.

In addition to the above-described examples, the switching operation sensing device may replace a volume switch and a power switch of a laptop, switches of VR, a head mounted display (HMD), Bluetooth earphones, a stylus touch pen, and the like, and may also replace buttons of a monitor of a home appliance, a refrigerator, a laptop, and the like.

For example, the button for controlling an operation may be integrated with a cover, a frame, or a housing of a device to which the switching operation sensing device is applied, and may be used for turning power on and off, controlling a volume, and other various functions (e.g., going back to a previous page, moving to a home screen, locking, and the like).

The switching operation sensing device may also include a plurality of touch switches to perform a plurality of functions when performing respective functions (e.g., going back to a previous page, moving to a home screen, locking, and the like).

The switching operation sensing device may not be limited to the above-mentioned devices, and may be applied to a device such as a mobile device, a wearable device, and the like, which requires a switch. Also, by applying the touch switch, an integrated design may be implemented.

When the switching operation sensing device of the example embodiment is applied to a mobile device, a thickness of the device may be reduced such that a simplified design may be implemented. Also, differently from a capacitive sensing method, a converter ADC may not be necessary, and when the switching operation sensing device is directly attached to a target surface of a switch member as an applicable structure, a spacer structure may not be necessary such that the switching operation sensing device may be easily implemented. Also, when using the switching operation sensing device, a dust-proofing and waterproofing switch may be implemented, and a duel sensing operation may be performed even in a humid environment, differently from a general sensing operation.

According to the aforementioned example embodiments, by implementing both the capacitive sensing operation and the inductive sensing operation using two sensing structures, a touch and an input force (pressure) may be simultaneously recognized.

Also, by using the switching operation sensing device, a thickness of a device may be reduced such that a more simplified design may be implemented. Further, by providing a dual-sensing structure which may sense both a touch and an input force, a touch, an input force, or a touch and an input force of a user may be sensed such that a user interface with higher usability may be provided in relation to inputting a control.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A switching operation sensing device configured to be applied to an electronic device, the electronic device comprising an input operation unit, the input operation unit disposed in a housing, comprising a first switch member and a second switch member, the switching operation sensing device comprising:
   an oscillator circuit configured to generate a first oscillation signal based on varying capacitance when the first switch member is touched, and a second oscillation signal based on varying inductance when an input force is applied to the second switch member;
   a frequency digital converter configured to convert the first oscillation signal to a first count value, and convert the second oscillation signal to a second count value; and
   a touch-force detector circuit configured to generate a first detection signal by detecting a touch input based on the first count value input from the frequency digital converter, and generate a second detection signal by detecting an input force based on the second count value.

2. The switching operation sensing device of claim 1, wherein the frequency digital converter is configured to generate the first count value by counting a clock signal using the first oscillation signal, and generate a second count value by counting a clock signal using the second oscillation signal.

3. The switching operation sensing device of claim 1, wherein the oscillator circuit comprises:
   a first oscillator circuit configured to generate the first oscillation signal based on the varying capacitance; and
   a second oscillator circuit configured to generate the second oscillation signal based on the varying inductance.

4. The switching operation sensing device of claim 3, wherein the first oscillator circuit comprises:
   a first inductance circuit including a first coil element disposed on an inner side surface of the first switch member;

a first capacitance circuit including a first capacitance device connected to the first inductance circuit and having varying capacitance when the first switch member is touched; and a first amplifier circuit configured to generate the first oscillation signal having a first resonant frequency based on the first inductance circuit and the first capacitance circuit.

5. The switching operation sensing device of claim 4, wherein the second oscillator circuit comprises:

a second inductance circuit including a second coil element spaced apart from an inner side surface of the second switch member;

a second capacitance circuit including a second capacitance device connected to the second inductance circuit; and a second amplifier circuit configured to generate the second oscillation signal having a second resonant frequency based on the second inductance circuit and the second capacitance circuit.

6. The switching operation sensing device of claim 5, wherein a surface of the first coil element is attached to an inner side surface of the first switch member and another surface is mounted on a first substrate;

wherein a surface of the second coil element is spaced apart from an inner side surface of the second switch member and another surface is mounted on the first substrate.

7. The switching operation sensing device of claim 1, wherein the frequency digital converter comprises:

a first frequency digital converter configured to convert the first oscillation signal to the first count value by counting the clock signal using the first oscillation signal received from the oscillator circuit; and a second frequency digital converter configured to convert the second oscillation signal to the second count value by counting the clock signal using the second oscillation signal received from the oscillator circuit.

8. The switching operation sensing device of claim 7, wherein the first frequency digital converter comprises:

a first frequency down converter configured to generate a firstly divided reference clock signal by dividing a reference frequency signal using a reference frequency divide ratio;

a first periodic timer configured to output a first period count value generated by counting a period of time of a first period of the firstly divided reference clock signal received from the first frequency down converter using the first oscillation signal; and a first CIC filter circuit configured to output the first count value generated by performing accumulative amplification for the first period count value received from the first periodic timer.

9. The switching operation sensing device of claim 8, wherein the first CIC filter circuit includes a decimator CIC filter configured to output the first count value generated by performing the accumulative amplification, perform the accumulative amplification using an accumulative gain determined by a predetermined integration stage order, a decimator factor, and a comb differentiation delay order, and provide the accumulative-amplified first period count value.

10. The switching operation sensing device of claim 7, wherein the second frequency digital converter comprises:

a second frequency down converter configured to generate a secondly divided reference clock signal by dividing a reference frequency signal using a reference frequency divide ratio;

a second periodic timer configured to output a second period count value generated by counting a period of time of a first period of the secondly divided reference clock signal received from the second frequency down converter using the second oscillation signal; and a second CIC filter circuit configured to output the second count value generated by performing accumulative amplification for the second period count value received from the second periodic timer.

11. The switching operation sensing device of claim 10, wherein the second CIC filter circuit includes a decimator CIC filter configured to output the second count value generated by performing the accumulative amplification, and perform the accumulative amplification using an accumulative gain determined by a predetermined integration stage order, a decimator factor, and a comb differentiation delay order and to provide the accumulative-amplified second period count value.

12. The switching operation sensing device of claim 10, wherein the touch-force detector circuit is configured to generate first and second differential values by differentiating the first count value and the second count value received from the frequency digital converter, respectively, compare the first and second differential values with a predetermined touch threshold value and a predetermined force threshold value, and output the first detection signal corresponding to a touch or the second detection signal corresponding to the input force based on a result of the comparison.

13. The switching operation sensing device of claim 10, wherein the touch-force detector circuit comprises:

a first delay circuit configured to output a first delay count value generated by delaying the first count value received from the first frequency digital converter by a period of time determined by a first delay control signal;

a first subtraction circuit configured to output a first differential value generated by subtracting the first count value from the first delay count value received from the first delay circuit;

a second delay circuit configured to output a second delay count value generated by delaying the second count value received from the second frequency digital converter by a period of time determined by a second delay control signal;

a second subtraction circuit configured to output a second differential value generated by subtracting the second count value from the second delay count value received from the second delay circuit; and a touch-force detector configured to compare the first differential value and the second differential value with a predetermined touch threshold value and a predetermined force threshold value, respectively, and output the first detection signal having a first level corresponding to a touch and the second detection signal having a second level corresponding to an input force.

14. The switching operation sensing device of claim 13, wherein the touch-force detector comprising:

a touch detector circuit configured to compare the first differential value with the predetermined touch threshold value and to output the first detection signal having the first level corresponding to the touch based on a result of the comparison; and a force detector circuit configured to compare the second differential value with the predetermined force threshold value and to output the second detection signal having the second level corresponding to the input force based on a result of the comparison.

15. The switching operation sensing device of claim 14, wherein the touch detector circuit comprises:

a touch slope direction detector configured to detect a degree and a direction of a touch slope based on the first differential value; and a touch detector configured to determine whether a touch is sensed or a touch is released by comparing the first differential value, the degree of the touch slope, with a touch hysteresis upper limit and a touch hysteresis lower limit based on the direction of the touch slope.

16. The switching operation sensing device of claim 14, wherein the force detector circuit comprises:

a force slope direction detector configured to detect a degree and a direction of a force slope based on the second differential value; and a force detector configured to determine whether a touch is sensed or a touch is released by comparing the second differential value, the degree of the force slope, with a force hysteresis upper limit and a force hysteresis lower limit based on the direction of the force slope.

17. The switching operation sensing device of claim 1, wherein the switching operation sensing device is any of Bluetooth headset, Bluetooth earphone, smart glasses, a VR headset, an AR headset, smart key button of a vehicle, laptop, computer, a head-mounted display (HMD), and a stylus touch pen.

18. An electronic device, comprising:

a housing;

an input operation unit, integrally formed with the housing, comprising a first switch member and a second switch member disposed in different positions; and a circuit unit configured to:

generate a first oscillation signal based on varying capacitance when the first switch member is touched, and a second oscillation signal based on varying inductance when an input force is applied to the second switch member;

convert the first oscillation signal to a first count value, and convert the second oscillation signal to a second count value; and generate corresponding detection signals based on the first count value input and the second count value.

19. The electronic device of claim 18, wherein an oscillator circuit, disposed in the housing, is configured to generate the first oscillation signal and the second oscillation signal.

20. The electronic device of claim 19, wherein a frequency digital converter, connected to the oscillator circuit, is configured to convert the first oscillation signal to the first count value and the second oscillation signal to the second count value.

21. The electronic device of claim 20, wherein a touch-force detector circuit, connected to the frequency digital converter, is configured to generate the first detection signal and the second detection signal.

22. The electronic device of claim 18, wherein the circuit unit is configured to generate the first count value by counting a clock signal using the first oscillation signal, and generate a second count value by counting a clock signal using the second oscillation signal.

23. The electronic device of claim 18, wherein the electronic device is any of Bluetooth headset, Bluetooth earphone, smart glasses, a VR headset, an AR headset, smart key button of a vehicle, laptop, computer, a head-mounted display (HMD), and a stylus touch pen.

* * * * *